United States Patent
Kuhwald et al.

(10) Patent No.: US 10,211,814 B2
(45) Date of Patent: Feb. 19, 2019

(54) METHOD FOR EQUALISING DISTORTED SIGNALS AND AN ASSOCIATED EQUALISATION FILTER

(71) Applicant: Rohde & Schwarz GmbH & Co. KG, Munich (DE)

(72) Inventors: Thomas Kuhwald, Markt Schwaben (DE); Bernhard Nitsch, Munich (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 0 days.

(21) Appl. No.: 15/112,603

(22) PCT Filed: Jan. 23, 2015

(86) PCT No.: PCT/EP2015/051366
§ 371 (c)(1),
(2) Date: Jul. 19, 2016

(87) PCT Pub. No.: WO2015/110582
PCT Pub. Date: Jul. 30, 2015

(65) Prior Publication Data
US 2016/0344372 A1 Nov. 24, 2016

(30) Foreign Application Priority Data
Jan. 23, 2014 (DE) .......... 10 2014 201 233

(51) Int. Cl.
*H03H 17/02* (2006.01)
*G01R 35/00* (2006.01)
(Continued)

(52) U.S. Cl.
CPC ....... *H03H 17/0213* (2013.01); *G01R 35/005* (2013.01); *G06F 17/14* (2013.01);
(Continued)

(58) Field of Classification Search
None
See application file for complete search history.

(56) References Cited

U.S. PATENT DOCUMENTS 5,512,898 A * 4/1996 Norsworthy ........... H03H 17/06
341/155
6,639,948 B1 * 10/2003 Tager ................ H03H 17/0273
375/285
(Continued)

FOREIGN PATENT DOCUMENTS

EP 0905945 B1 11/2002
WO 2015110582 A1 7/2015

OTHER PUBLICATIONS

Wei et al., "Sparse Filter Design Under a Quadratic Constraint: Low-Complexity Algorithms", IEEE Transactions on Signal Processing, Feb. 15, 2013, vol. 61, No. 4, retrieved on Apr. 6, 2016 from http://dspace.mit.edu/openaccess-disseminate/1721.1/90495, 15 Pages.
(Continued)

*Primary Examiner* — Michael D. Yaary
(74) *Attorney, Agent, or Firm* — Ditthavong & Steiner, P.C.

(57) ABSTRACT

The equalization filter implements an equalization of at least one signal distorted by a measurement setup. The filter coefficients of the equalization filter can be determined by minimizing a cost function K in which only sequences of filter coefficients which exert significant influence on the equalization are taken into consideration.

8 Claims, 11 Drawing Sheets

(51) Int. Cl.
*H03M 1/06* (2006.01)
*G06F 17/14* (2006.01)
*H03M 1/12* (2006.01)

(52) U.S. Cl.
CPC ...... *H03H 17/0219* (2013.01); *H03M 1/0626* (2013.01); *H03M 1/1205* (2013.01); *H03M 1/123* (2013.01); *H03M 1/1215* (2013.01); *H03M 1/1225* (2013.01)

(56) References Cited

U.S. PATENT DOCUMENTS

| 8,107,572 | B1* | 1/2012 | Furman | H04B 1/10 327/551 |
|---|---|---|---|---|
| 8,693,530 | B2* | 4/2014 | Wolcott | H04L 25/03019 375/229 |
| 2003/0109999 | A1 | 6/2003 | Stein et al. | |

OTHER PUBLICATIONS

Wei et al., "A Branch-and-Bound Algorithm for Quadratically-Constrained Sparse Filter Design", IEEE Transactions on Signal Processing, Feb. 15, 2013, vol. 61, No. 4, retrieved on Apr. 6, 2016 from http://www.rle.mit.edu/dspg/documents/Wei-sparseWLS2.pdf, 14 Pages.

Kocic et al., "Sparse Equalization for Real-Time Digital Underwater Acoustic Communications", Proceedings of the MTS/IEEE Oceans '95, Challenges of Our Changing Global Environment Conference, Oct. 9, 1995, vol. 3, pp. 1417-1422, 6 Pages.

Berberidis et al., "Efficient Decision Feedback Equalization for Sparse Wireless Channels", IEEE Transactions on Wireless Communications, May 2003, vol. 2, No. 3, retrieved on Apr. 6, 2016 from http://members.noa.gr/tronto/IEEE_TR_WC_MAY03.pdf, pp. 570-581, 12 Pages.

Lee et al., "Design of Nonuniformly Spaced Tapped-Delay-Line Equalizers for Sparse Multipath Channels", IEEE Transactions on Communications, Apr. 2004, vol. 52, No. 4, pp. 530-535, 6 Pages.

Agilent Technologies, "De-embedding and Embedding S-Parameter Networks Using a Vector Network Analyzer", Application Note 1364-1, May 30, 2004, retrieved on Apr. 6, 2016 from http://anlage.umd.edu/Microwave%20Measurements%20for%20Personal%20Web%20Site/5980-2784EN.pdf, 24 Pages.

Kuo et al., "Principle and Application of Adaptive Noise Equalizer", IEEE Transactions on Circuits and Systems II: Analog and Digital Signal Processing, Jul. 1994, vol. 41, No. 7, pp. 471-474, 4 Pages.

Written Opinion of the International Searching Authority for International Application No. PCT/EP2015/051366, dated Aug. 4, 2016, 17 Pages.

Notification of Transmittal of Translation of the International Preliminary Report on Patentability (Chapter I or Chapter II) for International Application No. PCT/EP2015/051366, dated Aug. 4, 2016, 3 Pages.

* cited by examiner

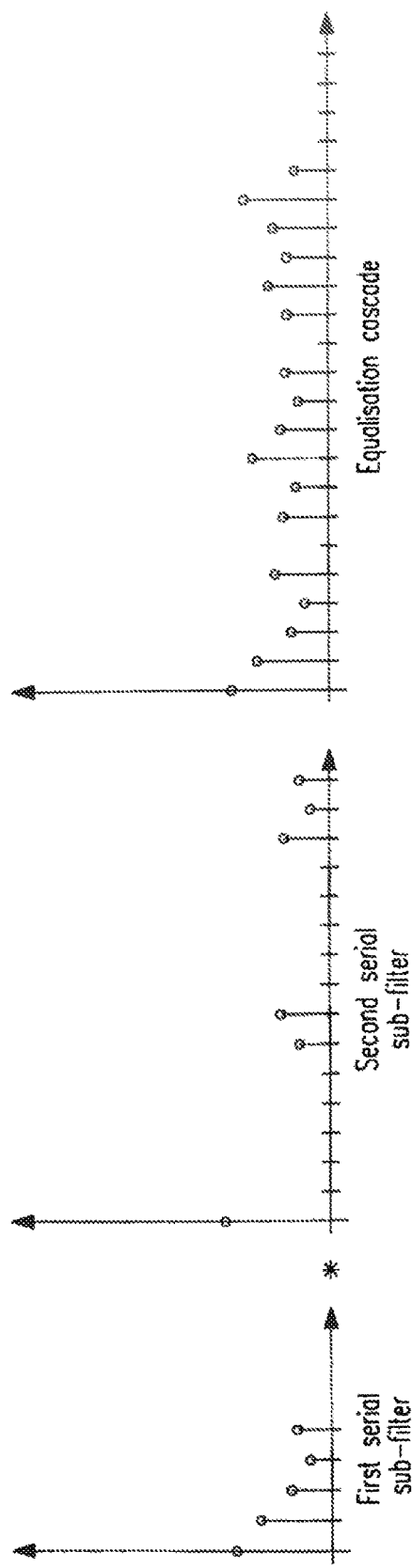

METHOD FOR EQUALISING DISTORTED SIGNALS AND AN ASSOCIATED EQUALISATION FILTER

CROSS-REFERENCE TO RELATED APPLICATIONS

The present application is a national phase application of PCT Application No. PCT/EP2015/051366, filed Jan. 23, 2015, which claims priority to German Patent Application No. 10 2014 201 233.3, filed on Jan. 23, 2014, the entire contents of which are herein incorporated by reference.

TECHNICAL FIELD

The present disclosure, according to the various embodiments described herein, relates to a method for equalising distorted signals and an associated equalisation filter.

BACKGROUND

A measurement signal is supplied via a measurement setup, which typically comprises a probe and a measurement line, to a measuring device, for example, a digital oscilloscope or spectrum analyser. The probe and the measurement line distort the measurement signal dependent upon their transmission function. The distortion of the measurement signal is equalised by an equaliser connected downstream of the measurement setup. The equaliser provides a transmission function which is inverted relative to the transmission function of the measurement setup and, at its output, generates a signal which ideally corresponds to the original measurement signal. While the distortion of the measurement signal is integrated, that is, embedded (English: "embedded") in the measurement procedure, the equalisation can consequently be designated as a deembedding (English: deembedding).

An equalisation of a measurement signal is typically implemented in blocks using an equalisation filter with a few hundred filter coefficients over a sequence of sampled values of the measurement signal with a block length of a few hundred sampled values. A digital equaliser of this kind is disclosed in US 2003/0109999 A1. The calculation of the equalisation consequently requires a large number of multiplications and additions which significantly limit the real-time capability of the measurement. The object of the invention is therefore to provide an equalisation of a measurement signal in real-time.

SUMMARY

Accordingly, there is provided a method for equalising a signal distorted by a probe and by an equalisation filter.

The filter coefficients of an equalisation filter are determined by minimising a cost function. In minimising the cost function according to the invention, only those sequences of respectively successive filter coefficients are taken into consideration which make a significant contribution to the equalisation. This significantly reduces the number of multiplications and additions to be implemented within the equalisation.

In certain embodiments, the minimisation of an error-squared criterion is used to minimise the cost function by minimising the difference, in each case for several frequencies, between the Fourier transformed filter coefficients of the equalisation filter and a predetermined reference-transmission function of the equalisation filter. The reference-transmission function of the equalisation filter corresponds to the inverse transmission function of the measurement setup.

The equalisation filter can be a digital filter with a finite length of the impulse response (a so-called Finite Impulse Response (FIR) filter).

Since the equalisation filter according to the invention also contains only those sequences of respectively successive filter coefficients which are in each case significantly different from zero and accordingly exert significant influence on the filter design or respectively on the result of the filter design, the equalisation filter according to the invention can be subdivided into several sub-filters, wherein each sub-filter contains respectively a sequence of successive filter coefficients which significantly influence the equalisation.

In certain embodiments, the sub-filters of the equalisation filter are parallelised relative to one another. Accordingly, the equalisation filter is additionally optimised in its real-time capability.

In a first variant, the identification of respectively successive filter coefficients to be taken into consideration in the cost function is implemented by varying the number of sequences of respectively successive filter coefficients, the relative position of the first coefficient of each sequence relative to the position of the first filter coefficient of the total equalisation filter and the filter length of each sequence. For each combination of sequences of filter coefficients specified in this manner, the values of the associated filter coefficients are then determined by minimising the cost function defined above. The combination of sequences of filter coefficients for which an applied evaluation criterion is minimal is finally selected from the accordingly determined filter coefficients of all combinations of sequences of filter coefficients.

In a first sub-variant associated with the first variant, either the magnitude difference or the phase difference between the Fourier transformed filter coefficients and the reference-transmission function of the equalisation filter—either the largest magnitude spacing or the largest phase spacing between the Fourier transformed filter coefficients and the reference-transmission function of the equalisation filter within the payload frequency range—is used as evaluation criterion.

In a second sub-variant associated with the first preferred variant, either the magnitude maximum or the phase maximum of the equalised transmission function of the measurement setup, that is, the transmission function of the measurement setup weighted with the Fourier-transformed filter coefficients, within the payload frequency range can be used as evaluation criterion.

In a third sub-variant associated with the first variant, the value of the applied cost function is used as evaluation criterion.

In a second preferred variant, the sequences of respectively successive filter coefficients to be taken into consideration in the cost function are identified by initially determining an equalisation filter with the maximum possible number of filter coefficients. Following this, the absolute values of all determined filter coefficients are averaged, and the sequences of respectively successive filter coefficients are determined by comparing the averaged absolute values of the determined filter coefficients with a threshold value.

In addition to an individual equalisation filter, an equalisation cascade comprising at least two serial sub-filters can also be realised. By preference, an equalisation cascade comprising a first serial sub-filter and a second serial sub-filter is realised.

The first serial sub-filter preferably contains the first sequence of respectively successive filter coefficients. The second serial sub-filter contains a single filter coefficient at the time zero and at least one sequence of respectively successive filter coefficients in each case from a subsequent time.

In order to determine the filter coefficients of the second and of each further serial sub-filter, the associated transmission function is initially determined from the determined filter coefficients of the first serial sub-filter and of each further, already determined serial sub-filter by means of Fourier transform. Following this, a reference-transmission function of the serial sub-filter still to be determined in each case is determined by dividing the reference-transmission function of the total equalisation filter by the transmission functions of all previously determined serial sub-filters. By minimising a cost function, the filter coefficients of the next serial sub-filter still to be measured are determined with the use of the determined reference-transmission function.

In other embodiments, only the comparatively slightly variable spectral components of the transmission function of the measurement setup are equalised with the first sub-filter.

In each case, the more strongly variable spectral components of the transmission function of the measurement setup are equalised with the second serial sub-filter and with each further serial sub-filter.

If more than two sequences of respectively successive filter coefficients are present, and if these filter coefficients are embedded only in a first and a second serial sub-filter, the second and every further sequence is realised, in each case, by a sub-sub filter associated with the second serial sub-filter and preferably operating in parallel with one another.

Because of the convolution with the filter coefficients of the first serial sub-filter, the individual sequences of respectively successive filter coefficients of the second serial sub-filter provide a smaller number of filter coefficients in each case than a single filter which provides the same filter characteristic as a filter cascade comprising first and second sub-filter. In this manner, the numerical complexity of the equalisation filter is additionally reduced.

The equalisation filter according to the invention is suitable for the equalisation of a single signal or of several signals, which is, or respectively are, distorted by the transmission function of the measurement setup.

The equalisation filter according to the invention provides several sub-filters connected to one another in parallel. In each case, one of the sequences of respectively successive filter coefficients to be taken into consideration in the cost function is allocated to each of these sub-filters configured in parallel. When equalising distorted signals which are each distorted differently by the typically different transmission function of each measurement setup, a different number of mutually parallelised sub-filters should be provided in the equalisation filter for each signal.

The supply of the individual signals to be equalised in parallel, which are each disposed at an input of the associated measurement channel, to the individual sub-filters of the equalisation filters operating in parallel with one another is preferably implemented in each case via a multiplexer unit disposed upstream of the respective parallel sub-filter.

Since the individual sub-filters operating in parallel are each supplied with the signal to be equalised synchronously via the multiplexer unit, a delay unit is connected, in each case upstream or downstream of the individual, mutually parallelised sub-filters, which guarantees the implementation of the equalisation of the sampled values of the signal to be equalised with the sequences of filter coefficients of the individual sub-filters, in each case at the correct time relative to one another—that is, at the correct time interval between each of the individual sequences of filter coefficients realised in each sub-filter.

The supply of the signal equalised by each parallel sub-filter to one of several signals equalised in an integrated manner is implemented a unit for connecting the sub-filter output signals through to an output channel.

In another embodiment of the unit for connecting the sub-filter output signals through to an output channel, multiplier elements, which are each connected downstream of the individual sub-filters, are provided. In this context, in each case, a number of multiplier elements corresponding to the number of signals to be equalised in parallel is connected downstream of each individual parallel sub-filter, which connects the signal equalised by the parallel sub-filter to one of the outputs, which are allocated respectively to a measurement channel of a signal to be equalised. The addition of each of the signals partially equalised in the individual sub-filters to form an integrated equalised signal takes place in each case in a summation element which is allocated to each measurement channel of the signal to be equalised and is connected downstream of the multiplier elements associated with the respective measurement channel.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

In the following, exemplary embodiments of the method according to the invention for the equalisation of at least one signal distorted by a measurement setup and of the associated equalisation filter are explained in detail by way of example on the basis of the drawings. The drawings show:

FIG. 7 three time-flow charts explaining the equalisation cascade; and

DETAILED DESCRIPTION

Figure 1A:
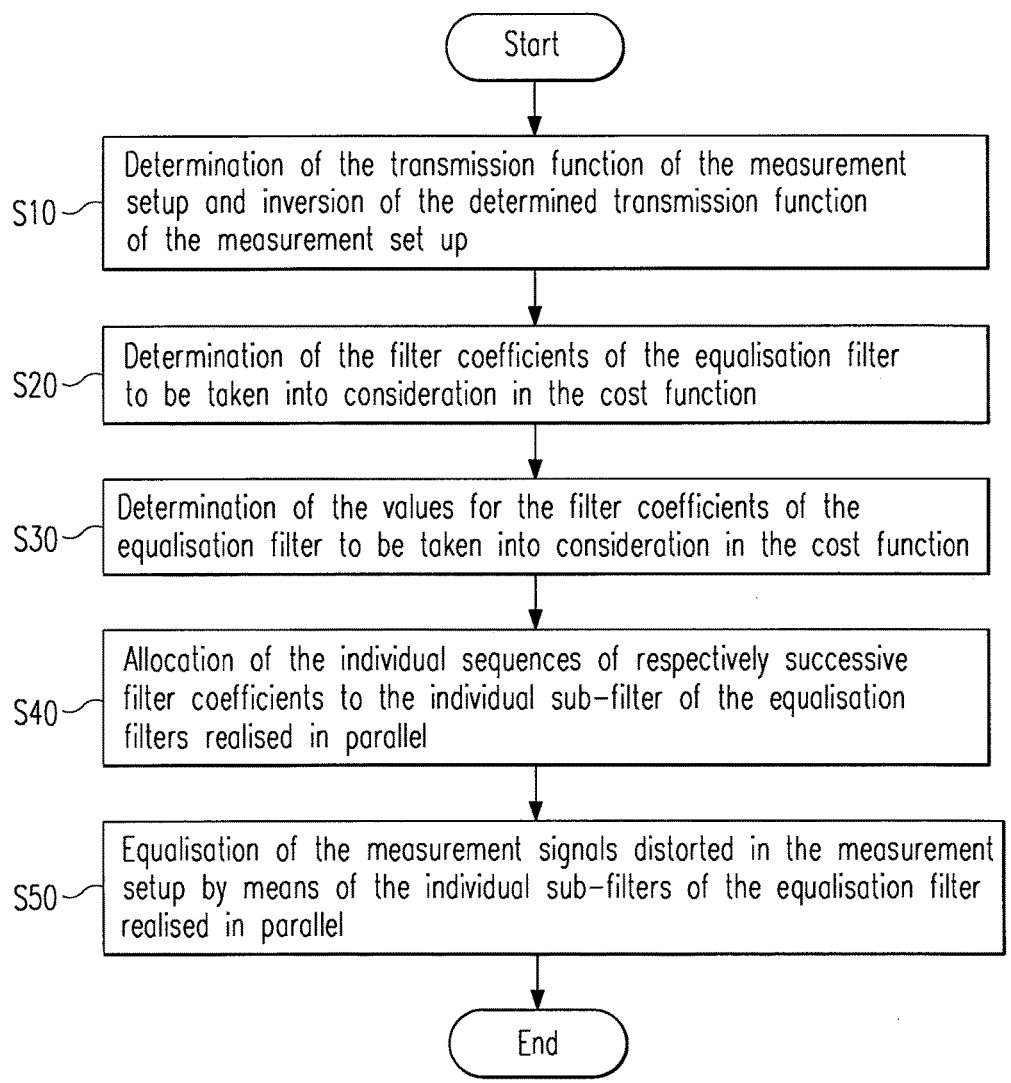
FIG. 1A a flow chart of an exemplary embodiment of the method for the equalisation of at least one signal distorted by a measurement setup with an equalisation filter comprising several parallel sub-filters.

Before exemplary embodiments of the method according to the present disclosure for the equalisation of at least one signal distorted by a measurement setup and exemplary embodiments of the associated equalisation filter are explained in detail, the mathematical derivations required for an understanding of the present disclosure will be explained in the following.

According to equation (1), the convolution of a distorted input signal x(k) with the impulse response h($\xi$) of the equalisation filter of filter length L leads to an equalised output signal y(k):

$$y(k) = \sum_{\xi=0}^{L-1} h(\xi) \cdot x(k-\xi) \quad (1)$$

If the equalisation is not implemented in a single equalisation filter, but in a total of $\overline{N}$ equalisation sub-filters, which each provide an impulse response $h_\mu(\xi)$ and each filter the distorted input signal x(k) respectively with an spacing $N_\mu$ from the sampling time zero, the equalised output signal y(k) is obtained according to equation (2A):

$$y(k) = \sum_{\mu=0}^{\overline{N}-1} \sum_{\xi=0}^{L_\mu-1} h_\mu(\xi) \cdot x(k - N_\mu - \xi) \quad (2A)$$

If several signals are equalised in parallel by an equalisation filter of this kind, the equalised output signal y(k) of the i-th signal to be equalised is obtained according to equation (2B):

$$y_i(k) = \sum_{\mu=0}^{\overline{N}-1} \sum_{\xi=0}^{L_{i,\mu}-1} h_{i,\mu}(\xi) \cdot x_i(k - N_{i,\mu} - \xi) \quad (2B)$$

For the filter design of an equalisation filter according to the invention which is realised as an FIR filter, a cost function K is used. In order to determine the filter coefficients of the FIR filter, this cost function K is minimised using the criterion of the smallest error squared. The error in the cost function K is obtained from the weighted difference between the transmission function $H(f/f_a)$ of the FIR filter, which is obtained by Fourier transform from the filter coefficients of the FIR filter to be determined, and the desired reference transmission function $H_d(f/f_a)$ of the FIR filter.

The transmission function $H(f/f_a)$ of the FIR filter, of which the argument is the frequency f scaled to the sampling frequency $f_a$, is obtained according to equation (3) by Fourier transform with the variable $Z = e^{j2\pi f/f_a}$ from the impulse response $h_{FIR}(\xi)$ of the FIR filter:

$$H(f/f_a) = \sum_{\xi=0}^{L_{FIR}-1} h_{FIR}(\xi) \cdot z^{-\xi} \quad (3)$$

According to equation (4), the sum in equation (3) can be substituted by a vector product with the vector $\underline{h}_{FIR}$ of the impulse-response coefficient according to equation (5) and the vector $\underline{z}_{FIR}(f/f_a)$ of the variable $z = e^{j2\pi f/f_a}$ according to equation (6):

$$H(f/f_a) = \underline{z}_{FIR}^T(f/f_a) \cdot \underline{h}_{FIR} \quad (4)$$

$$\underline{h}_{FIR} = [\, h_{FIR}(0) \quad h_{FIR}(1) \quad \ldots \quad h_{FIR}(L_{FIR}-1) \,]^T \quad (5)$$

$$\underline{z}_{FIR}(f/f_a) = \left[\, e^{-j2\pi \frac{f}{f_a} 0} \quad e^{-j2\pi \frac{f}{f_a} 1} \quad \ldots \quad e^{-j2\pi \frac{f}{f_a}(L_{FIR}-1)} \,\right]^T \quad (6)$$

Accordingly, in general, starting from equation (4), the cost function K is obtained according to equation (7):

$$K = \sum_{\xi=0}^{N-1} W(f_\xi/f_a) \cdot |\underline{z}_{FIR}^T(f_\xi/f_a) \cdot \underline{h}_{FIR} - H_d(f_\xi/f_a)|^2 \quad (7)$$

According to the invention, only those filter coefficients and the associated variable $z = e^{j2\pi f/f_a}$ which exert a significant influence on the equalisation result are taken into consideration in the cost function K. In this context, significant preferably means that the filter coefficients taken into consideration are disposed above a specified threshold value or are different from zero. In equation (8), a total of three sequences of successive filter coefficients, which exert a significant influence on the equalisation and are separated from one another by a vertical line, are presented by way of example.

$$\underline{h}_{FIR} = [\, h_{FIR}(N_0) \;\; h_{FIR}(N_0+1) \;\; \ldots \;\; h_{FIR}(N_0+L_0-1) \qquad (8)$$
$$h_{FIR}(N_1) \;\; h_{FIR}(N_1+1) \;\; \ldots \;\; h_{FIR}(N_1+L_1-1)$$
$$h_{FIR}(N_2) \;\; h_{FIR}(N_2+1) \;\; \ldots \;\; h_{FIR}(N_2+L_2-1)\,]$$

$$\underline{z}_{FIR}(f/f_a) = \left[\, e^{-j2\pi\frac{f}{f_a}N_0} \;\; e^{-j2\pi\frac{f}{f_a}(N_0+1)} \;\; \ldots \;\; e^{-j2\pi\frac{f}{f_a}(N_0+L_0-1)} \;\middle|\; \right. \qquad (9)$$
$$e^{-j2\pi\frac{f}{f_a}N_1} \;\; e^{-j2\pi\frac{f}{f_a}(N_1+1)} \;\; \ldots \;\; e^{-j2\pi\frac{f}{f_a}(N_1+L_1-1)} \;\middle|\;$$
$$\left. e^{-j2\pi\frac{f}{f_a}N_2} \;\; e^{-j2\pi\frac{f}{f_a}(N_2+1)} \;\; \ldots \;\; e^{-j2\pi\frac{f}{f_a}(N_2+L_2-1)} \,\right]^T$$

The equalisation filter, of which the filter coefficients are determined by minimising the cost function K, can be subdivided into several sub-filters, wherein a sequence of respectively successive filter coefficients is allocated to each sub-filter. Consequently, three sub-filters with the respective filter lengths $L_0$, $L_1$ and $L_2$ are obtained from equation (8), wherein the first filter coefficients of the respective sub-filter are positioned at the relative position $N_0$, $N_1$ and $N_2$ relative to the first filter coefficient of the total equalisation filter. Equation (10) delivers the associated allocation of the individual filter coefficients of the total equalisation filter, for example, to the three sub-filters.

$$\underline{h}_{FIR}[h_{FIR0}(0)\; h_{FIR0}(1) \ldots h_{FIR0}(L_0-1)|h_{FIR1}(0)\; h_{FIR1}$$
$$(1) \ldots h_{FIR1}(L_1-1)|h_{FIR2}(0)\; h_{FIR2}(1) \ldots h_{FIR2}$$
$$(L_2-1)]^T \qquad (10)$$

In order to minimise the cost function K according to equation (7), this cost function K can be presented in an equivalent manner in matrix-vector format according to equation (11), with the matrix $\underline{\underline{A}}$ according to equation (12) and the vector $\underline{b}$ according to equation (13).

$$K = \left[\underline{\underline{A}} \cdot \underline{h}_{FIR} - \underline{b}\right]^H \cdot \operatorname{diag}\{\underline{W}\} \cdot \left[\underline{\underline{A}} \cdot \underline{h}_{FIR} - \underline{b}\right] \qquad (11)$$

$$\underline{\underline{A}} = \begin{bmatrix} \underline{z}_{FIR}(f_0/f_a) \\ \underline{z}_{FIR}(f_1/f_a) \\ \vdots \\ \underline{z}_{FIR}(f_{N-1}/f_a) \end{bmatrix} \qquad (12)$$

$$\underline{b} = [\, H_d(f_0/f_a) \;\; H_d(f_1/f_a) \;\; \ldots \;\; H_d(f_{N-1}/f_a)\,]^T \qquad (13)$$

After multiplying out, the cost function K according to equation (11) leads to equation (14) with the matrix $\underline{\underline{\tilde{A}}}$ according to equation (15), the vector $\underline{\tilde{b}}$ according to equation (16) and the scalar $\tilde{c}$ according to equation (17)

$$K = \underline{h}_{FIR}^T \cdot \underline{\underline{\tilde{A}}} \cdot \underline{h}_{FIR} + \underline{\tilde{b}}^T \cdot \underline{h}_{FIR} + \tilde{c} \qquad (14)$$

$$\underline{\underline{\tilde{A}}} = \operatorname{Real}\{[\sqrt{\operatorname{diag}\{\underline{W}\}} \cdot \underline{\underline{A}}]^H \cdot [\sqrt{\operatorname{diag}\{\underline{W}\}} \cdot \underline{\underline{A}}]\} \qquad (15)$$

$$\underline{\tilde{b}} = -2 \cdot \operatorname{Real}\{[\sqrt{\operatorname{diag}\{\underline{W}\}} \cdot \underline{\underline{A}}]^H \cdot [\sqrt{\operatorname{diag}\{\underline{W}\}} \cdot \underline{b}]\} \qquad (16)$$

$$\tilde{c} = [[\sqrt{\operatorname{diag}\{\underline{W}\}} \cdot \underline{b}]^H \cdot [\sqrt{\operatorname{diag}\{\underline{W}\}} \cdot \underline{b}]] \qquad (17)$$

By differentiating and setting the cost function K to zero according to the impulse response $\underline{h}_{FIR}$, as shown in the equation (14), a solution is obtained for the determination of the impulse response $\underline{h}_{FIR}$ of the equalisation filter as shown in equation (18).

$$\underline{h}_{FIR} = -\frac{1}{2} \cdot \underline{\underline{\tilde{A}}}^{-1} \cdot \underline{\tilde{b}} \qquad (18)$$

If the equalisation filter is realised by means of an equalisation cascade comprising sub-filters connected in series, the first sequence of successive filter coefficients which exert significant influence on the equalisation is allocated to the first serial sub-filter—with the index A. For this purpose, the cost function K is again minimised, as shown in equation (7), wherein, within the cost function K, a vector $\underline{h}_{FIRA}$ of the filter coefficients according to equation (19) and a vector $\underline{z}_{FIRA}(f/f_a)$ of the variable $z = e^{j2\pi f/f_a}$ according to equation (20) is used.

$$\underline{h}_{FIRA} = [\, h_{FIRA}(N_0) \;\; h_{FIRA}(N_0+1) \;\; \ldots \;\; h_{FIRA}(N_0+L_0-1)\,]^T \qquad (19)$$

$$\underline{z}_{FIRA}(f/f_a) = \left[\, e^{-j2\pi\frac{f}{f_a}N_0} \;\; e^{-j2\pi\frac{f}{f_a}(N_0+1)} \;\; \ldots \;\; e^{-j2\pi\frac{f}{f_a}(N_0+L_0)}\,\right]^T \qquad (20)$$

From the filter coefficients $\underline{h}_{FIRA}$ of the first serial sub-filter determined by minimising the cost function K according to equation (7), taking into consideration equation (19) and (20), the associated transmission function $H_A(f/f_a)$ is obtained using the Fourier transform according to equation (21).

$$H_A(f/f_a) = \operatorname{FFT}\{\underline{h}_{FIRA}\} \qquad (21)$$

The filter coefficients $\underline{h}_{FIRB}$ of a second serial sub-filter—with the index B—are obtained, in turn, by minimising a cost function K according to equation (7). The reference transmission function $\tilde{H}_d(f/f_a)$ for the second serial sub-filter to be taken into consideration in this context is obtained according to equation (22) by dividing the reference transmission function $H_d(f/f_a)$ for the total equalisation filter by the transmission function $H_A(f/f_a)$ of the first serial sub-filter determined in equation (21).

$$\tilde{H}_d(f/f_a) = \frac{H_d(f/f_a)}{H_A(f/f_a)} \qquad (22)$$

The filter coefficients $\underline{h}_{FIRB}$ for the second serial sub-filter to be taken into consideration in the cost function K are obtained according to equation (23A) for the case that the second serial sub-filter provides a filter coefficient at the start of the sequence of filter coefficients for the total equalisation filter and only one single further sequence of successive filter coefficients.

The filter coefficients $\underline{h}_{FIRB}$ for the second serial sub-filter to be taken into consideration in the cost function K are obtained according to equation (23A) for the case that the second serial sub-filter provides a filter coefficient at the start of the sequence of filter coefficients for the total equalisation filter and several sequences of successive filter coefficients (for example, two further sequences, in equation (23B)).

$$\underline{h}_{FIRB} = [h_{FIRB}(N_0)|h_{FIRB}(N_1)\; h_{FIRB}(N_1+1) \ldots h_{FIRB}$$
$$(N_1+L_1-1)]^T \qquad (23A)$$

$$\underline{h}_{FIRB} = [h_{FIRB}(N_0)|h_{FIRB}(N_1)\; h_{FIRB}(N_1+1) \ldots h_{FIRB}$$
$$(N_1+L_1-1)|h_{FIRB}(N_2)\; h_{FIRB}(N_2+1) \ldots h_{FIRB}$$
$$(N_2+L_2-1)]^T \qquad (23B)$$

The filter lengths $L_1$ and $L_2$ of the individual sequences of respectively successive filter coefficients of the second serial sub-filter according to equation (23A) and respectively (23B) are shorter, because of the convolution with the filter coefficients of the first serial sub-filter, than the filter lengths of the corresponding sequences of respectively successive filter coefficients for the total equalisation filter.

If several sequences of respectively successive filter coefficients are present according to equation (23B), only one sequence of respectively successive filter coefficients can be realised in the second serial sub-filter according to equation (23A), while the other sequences are taken over by a third and/or further serial sub-filters. For this purpose, once again, with reference to equation (22), a reference transmission function $H_d(f/f_a)$ for the third serial sub-filter or respectively for further serial sub-filters should be used in minimising the respective cost function K, which is obtained by dividing the reference transmission function $H_d(f/f_a)$ for the total equalisation filter and the product of the transmission functions of all serial sub-filters determined so far. The definition of the vector $\underline{h}_{FIRi}$ of the filter coefficients for the i-th serial sub-filter to be determined in the cost function K according to equation (7) should be implemented correspondingly, with reference to equation (23A) or respectively (23B).

The problem of determining the sequences of respectively successive filter coefficients to be taken into consideration in the cost function K according to equation (7) is resolved as follows:

In a first variant, this is implemented by varying the number of sequences, by varying the position $N_i$ of the first filter coefficient of the individual sequence i relative to the position of the first filter coefficient of the total equalisation filter and by varying the filter length $L_i$ of the individual sequence i and determining the transmission function $H_{FIRk}(f/f_a)$ of the total equalisation filter associated with the respective variation k from the Fourier transform of the filter coefficient $\underline{h}_{FIRk}$ associated with the variation k, which can be determined, in turn, with reference to equation (18).

In a first sub-variant of the first variant, on the basis of the transmission functions, which are typically presented on a logarithmic scale, either the maximal magnitude difference or the maximal phase difference between the log reference transmission function $H_{d\ log}(f/f_a)$ for the total equalisation filter and the log transmission function $H_{FIR\ log\ k}(f/f_a)$ associated with the respective variation k is obtained as evaluation criterion to be minimised for the determination of the optimum variation $k_{Opt}$ and of the filter lengths $L_{iOpt}$ and respectively associated positions $N_{iOpt}$ of the first filter coefficient of the individual sequences i relative to the position of the first filter coefficient of the total equalisation filter respectively associated with the optimum variation $k_{Opt}$.

By preference, the maximal magnitude spacing according to equation (24A) and the maximal phase spacing according to equation (24B), in each case between the log reference transmission function $H_{d\ log}(f/f_a)$ for the total equalisation filter and the log transmission function $H_{FIR\ log\ j}(f/f_a)$ of the total equalisation filter associated with the respective variation k, in each case with a frequency $f/f_a$, can be regarded as the maximal magnitude difference and respectively as the maximal phase difference.

$$k_{Opt} = \operatorname*{Min}_{k}\left\{\operatorname*{Max}_{f/f_a}\left\{\frac{|H_{dlog}(f/f_a)|}{|H_{FIRlogk}(f/f_a)|}\right\}\right\} \quad (24A)$$

$$k_{Opt} = \operatorname*{Min}_{k}\left\{\operatorname*{Max}_{f/f_a}\{|\arg\{H_d(f/f_a)\} - \arg\{H_{FIRk}(f/f_a)\}|\}\right\} \quad (24B)$$

In a second sub variant of the first variant, the evaluation criterion to be minimised for the determination of the optimum variation $k_{Opt}$ is obtained either as the magnitude maximum according to equation (25A) or as the phase maximum according to equation (25B) of the log transmission function $$\frac{1}{H_{dlog}(f/f_a)}$$

of the measurement setup equalised with the log transmission function $H_{FIR\ log\ k}(f/f_a)$ of the equalisation filter determined after the variation k, in each case with a frequency $f/f_a$.

$$k_{Opt} = \operatorname*{Min}_{k}\left\{\operatorname*{Max}_{f/f_a}\left\{\frac{|H_{FIRlogk}(f/f_a)|}{|H_{dlog}(f/f_a)|}\right\}\right\} \quad (25A)$$

$$k_{Opt} = \operatorname*{Min}_{k}\left\{\operatorname*{Max}_{f/f_a}\{\arg\{H_{FIRk}(f/f_a)\} - \arg\{H_d(f/f_a)\}\}\right\} \quad (25B)$$

In a third sub-variant of the first variant, according to equation (26), the value $K_k$ of the cost function determined after the variation k is determined as the evaluation criterion to be minimised in order to determine the optimum variation $k_{Opt}$.

$$k_{Opt} = \operatorname*{Min}_{k}\{K_k\} \quad (26)$$

In a second variant, the filter coefficients of the total equalisation filter are determined by minimising the cost function K according to equation (7). In this context, all filter coefficients are taken into consideration in the filter design over the total filter length $L_{Tot}$ of the total equalisation filter.

The absolute values $|\underline{h}_{FIR}|=[|h_{FIR}(0)|\ |h_{FIR}(1)|\ \ldots\ |h_{FIR}(L_{Tot}-1)|]$ are obtained from the determined filter coefficients $\underline{h}_{FIR}=[h_{FIR}(0)\ h_{FIR}(1)\ \ldots\ h_{FIR}(L_{Tot}-1)]$. By averaging the absolute values of a given number of filter coefficients positioned on the right and left side, averaged absolute values $|\overline{\underline{h}}_{FIR}|=[|\overline{h}_{FIR}(0)|\ |\overline{h}_{FIR}(1)|\ \ldots\ |\overline{h}_{FIR}(L_{Tot}-1)|]$ are then determined. The averaged absolute values $|\overline{\underline{h}}_{FIR}|=[|\overline{h}_{FIR}(0)|\ |\overline{h}_{FIR}(1)|\ \ldots\ |\overline{h}_{FIR}(L_{Tot}-1)|]$ are then compared individually with regard to overshooting a threshold value SW. Starting from condition (27), the position $N_i$ for a first filter coefficient of every sequence i relative to the first filter coefficient of the total equalisation filter and the filter length $L_i$ of this sequence i can be determined.

$$h_{FIR}(N_i-1)<SW \wedge h_{FIR}(N_i+j)>SW \forall j=0,1,\ldots,$$
$$L_i-1 \wedge h_{FIR}(N_i+L_i)<SW \quad (27)$$

In the following, an exemplary embodiment of the method according to the invention for equalising at least one signal distorted by a measurement setup with an equalisation filter comprising several sub-filters configured in parallel with one another is explained with reference to the flowchart in FIG. 1A.

In the first method step S10 of the method according to the invention, the transmission function of the measurement setup 1 to be used is determined, which typically comprises a probe 2 and a measurement line 3 connected downstream of the probe 2. For this purpose, all possible time-domain orientated and spectral-domain orientated methods for determining the transmission behaviour of a transmission element according to the prior art can be used. In the same method step S10, after the determination of the transmission function of the measurement setup 1, the determined transmission function of the measurement setup 1 is inverted in all its frequency-sampling points.

In the next method step S20, the sequences of respectively successive filter coefficients of the equalisation filter to be taken into consideration in the cost function K are determined. Accordingly, only sequences of respectively successive filter coefficients which exert significant influence on the equalisation on the basis of their values are taken into consideration.

In this context, in a first variant for determining the sequences of respectively successive filter coefficients to be taken into consideration, on the one hand, the number of sequences with respectively successive filter coefficients, and, on the other hand, the associated filter length $L_i$ and the associated relative position $N_i$ of the first filter coefficient of each sequence i from the position of the first filter coefficient of the total equalisation filter for each of the sequences i are varied.

On the basis of the filter coefficients to be taken into consideration in the variation k in the cost function K, the values of these filter coefficients $\underline{h}_{FIRk}$, are determined according to equation (18), taking into consideration equation (15) for the matrix $\underline{A}$ and according to equation (16) for the vector $\underline{b}$.

The matrix A used in this context can be determined according to equation (12) on the basis of the vectors $\underline{z}_{FIR}(f/f_a)$ for the individual measurement frequencies $f/f_a$, wherein each vector $\underline{z}_{FIR}(f/f_a)$ is defined with reference to equation (19) corresponding to the filter coefficients to be taken into consideration in the cost function K. According to equation (13), the vector $\underline{b}$ contains the values of the reference transmission function $H_d(f/f_a)$ for the equalisation filter to be determined for the individual measurement frequencies $f/f_a$, which are obtained from the values of the inverse transmission function of the measurement setup 1 determined in method step S10 for the individual measurement frequencies $f/f_a$.

By means of Fourier transform, the associated transmission function $H_{FIRk}(f/f_a)$ is determined from the filter coefficients $\underline{h}_{FIRk}$ of the equalisation filter determined accordingly for the variation k.

In a first sub-variant of the first variant for determining the filter coefficients to be taken into consideration in the cost function K, either the magnitude difference or the phase difference between the reference transmission function $H_d(f/f_a)$ of the equalisation filter and the transmission function $H_{FIRk}(f/f_a)$ of the equalisation filter determined for the variation k is determined. By preference, according to equation (24A), the maximum in the magnitude frequency response between the reference transmission function $H_d(f/f_a)$ of the equalisation filter and the transmission function $H_{FIRk}(f/f_a)$ of the equalisation filter determined for the variation k is determined in the payload frequency range as the magnitude difference between the reference transmission function $H_d(f/f_a)$ of the equalisation filter and the transmission function $H_{FIRk}(f/f_a)$ determined for the variation k, and the maximum in the phase frequency response between the reference transmission function $H_d(f/f_a)$ of the equalisation filter and the transmission function $H_{FIRk}(f/f_a)$ of the equalisation filter determined for the variation k is determined in the payload frequency range for every variation k as the phase difference between the reference transmission function $H_d(f/f_a)$ of the equalisation filter and the transmission function $H_{FIRk}(f/f_a)$ determined for the variation k according to equation (24B).

From the maximum determined in each case for every variation k in the magnitude frequency response and respectively in the phase frequency response, the smallest maximum is determined. The variation k associated with the smallest maximum in the magnitude frequency response and respectively in the phase frequency response delivers the individual sequences i to be taken into consideration in the cost function K of respectively successive filter coefficients and their associated filter lengths $L_i$ and their associated relative position $N_i$ of the first filter coefficient relative to the first filter coefficient of the total equalisation filter.

As an alternative, the weighted mean value of all spectral values of the magnitude frequency response between the reference transmission function $H_d(f/f_a)$ of the equalisation filter and the transmission function $H_{FIRk}(f/f_a)$ of the equalisation filter determined for the variation k in the payload frequency range can also be used as the magnitude difference, and the weighted mean value of all spectral values of the phase frequency response between the reference transmission function $H_d(f/f_a)$ of the equalisation filter and the transmission function $H_{FIRk}(f/f_a)$ of the equalisation filter determined for the variation k in the payload frequency range or another spacing dimension for the magnitude difference and respectively the phase difference can also be used as the phase difference.

In a second sub-variant of the first variant for determining the filter coefficients to be taken into consideration in the cost function K, either the maximum in the magnitude frequency response of the transmission function of the measurement setup 1 equalised with the transmission function of the equalisation filter of the variation k is determined according to equation (25A), or the maximum in the phase response of the transmission function of the measurement setup 1 equalised with the transmission function of the equalisation filter of the variation k is determined according to equation (25B). In an equivalent manner, the smallest maximum is determined from the maximum in the magnitude frequency response or respectively in the phase frequency response determined in each case for every variation k. The variation k associated with the smallest maximum in the magnitude frequency response and respectively in the phase frequency response delivers the individual sequences i of respectively successive filter coefficients to be taken into consideration in the cost function K and their associated filter lengths $L_i$ and their associated relative position $N_i$ of the first filter coefficient relative to the first filter coefficient of the total equalisation filter.

In a third sub-variant of the first variant for determining the filter coefficients to be taken into consideration in the cost function K, the value $K_k$ of the cost function according to equation (7) determined after the variation k is used according to equation (26) as the evaluation criterion to be minimised in order to determine the optimum variation $k_{Opt}$ of filter coefficients to be taken into consideration.

In a second variant for determining the sequences of respectively successive filter coefficients to be taken into consideration in the cost function K the values for the filter coefficients $\underline{h}_{FIR}$ of the total equalisation filter are initially determined with a minimisation of the cost function K using equation (18), taking into consideration equations (12), (13), (15) and (16), as already described above with reference to the first variant.

Figure 8:
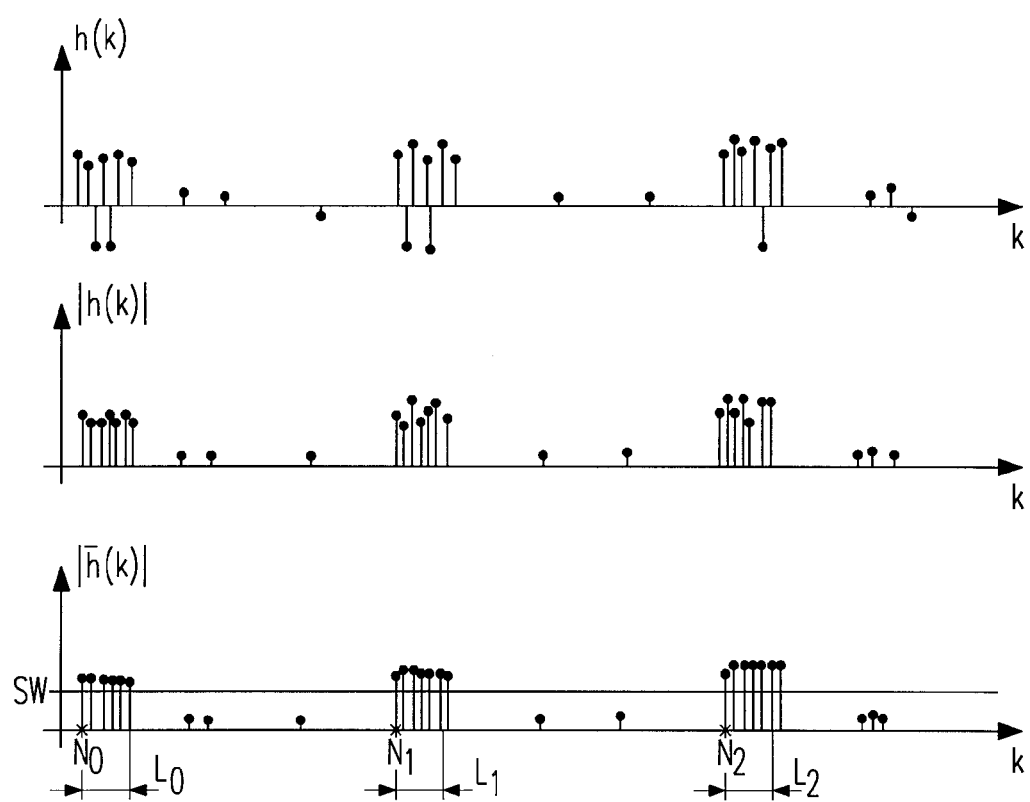
FIG. 8 several time-flow charts explaining the second variant for determining the filter coefficients to be taken into consideration in the cost function.

Following this, as shown in the time-flow diagrams in FIG. 8, the absolute values $|h_{FIR}(k)|$ of the determined filter coefficients $h_{FIR}(k)$ are determined (second time-flow diagram in FIG. 8). In each case, an averaged absolute value $|\underline{h}_{FIR}(k)|$ of a filter coefficient $h_{FIR}(k)$ is determined for every absolute value $|h_{FIR}(k)|$ of a filter coefficient $h_{FIR}(k)$ determined in this manner (third time-flow diagram in FIG. 8). For this purpose, an appropriately selected number of absolute values of filter coefficients on the right and on the left is taken into consideration in the respective averaging with regard to the absolute value $|h_{FIR}(k)|$ of a filter coefficient $h_{FIR}(k)$ to be averaged. The averaged absolute values $|\bar{h}_{FIR}(k)|$ of the filter coefficients $h_{FIR}(k)$ are compared with an appropriately selected threshold value SW, as presented in the third time-flow diagram of FIG. 8.

The conditions presented in equation (27) deliver criteria for determining the filter length $L_i$ associated in each case with every sequence i of respectively successive filter coefficients and the respectively associated position $N_i$ of the first filter coefficient relative to the first filter coefficient of the total equalisation filter, as also presented schematically in the third time-flow diagram of FIG. 8.

Figure 3:
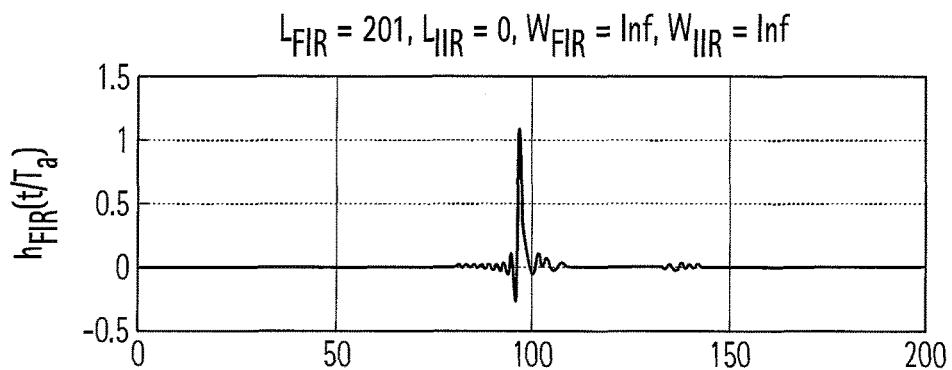
FIG. 3 a time-flow chart of the impulse response of an exemplary embodiment of the equalisation filter.

By way of example, FIG. 3 shows that, in the environment of $k_0=96$, in each case 40 impulse-response coefficients, and in the environment of $k_1=138$, in each case 10 impulse-response coefficients of the impulse response $h_{FIR}(t/T_a)$ of the equalisation filter to be determined with the time t scaled to the sampling interval $T_a$ as argument are significantly different from zero and accordingly exert a significant influence on the equalisation. The impulse-response coefficients of the impulse response $h_{FIR}(t/T_a)$ of the equalisation filter to be determined which must be taken into consideration in the cost function K are displaced for the equalisation in such a manner that the first sequence of respectively successive impulse-response coefficients—that is, the sequence of successive impulse response coefficients in the environment of $k_0=96$—comes to be disposed onward from the sampling time zero.

In the next method step S30, the impulse response $\underline{h}_{FIR}$ of the single equalisation filter, which has been determined by minimising a cost function K on the basis of the smallest mean error squared criterion, is determined according to equation (18). For this purpose, the matrix $\underline{\underline{A}}$ according to equation (15) and the vector $\underline{b}$ according to equation (16), which are obtained, in turn, from the weighting function $\underline{W}$ and the matrix $\underline{\underline{A}}$ according to equation (12) and the vector $\underline{b}$ according to equation (13), are calculated. In each case, for the individual measurement frequencies $f/f_a$, the matrix $\underline{\underline{A}}$ contains the individual variables $z=e^{j2\pi f/f_a}$ for the Fourier transform of the filter coefficients to be taken into consideration in the cost function K, and in each case, the vector $\underline{b}$ contains the desired reference transmission functions $H_d(f/f_a)$ which correspond to the inverse transmission function of the measurement setup 1 determined in method step S10.

In the next method step S40, each individual sequence of respectively successive filter coefficients which were determined in the preceding method step S30 is subdivided with reference to equation (10), in each case, to a parallel sub-filter of the equalisation filter.

In the final method step S50, the signals $z(t)$ measured by the measurement setup 1, which are delivered to the equalisation filter as distorted measurement signals $\underline{x}(t)$, are convoluted, in each case after an analog-digital conversion, with the filter coefficients $h_{\mu FIR}(\xi)$ to be taken into consideration for the equalisation from method step S30 with reference to equation (2) and accordingly equalised.

While method steps S10 to S40 are implemented only once in advance within a calibration phase, only method step S50 is preferably implemented continuously throughout the total measurement process.

Figure 2A:
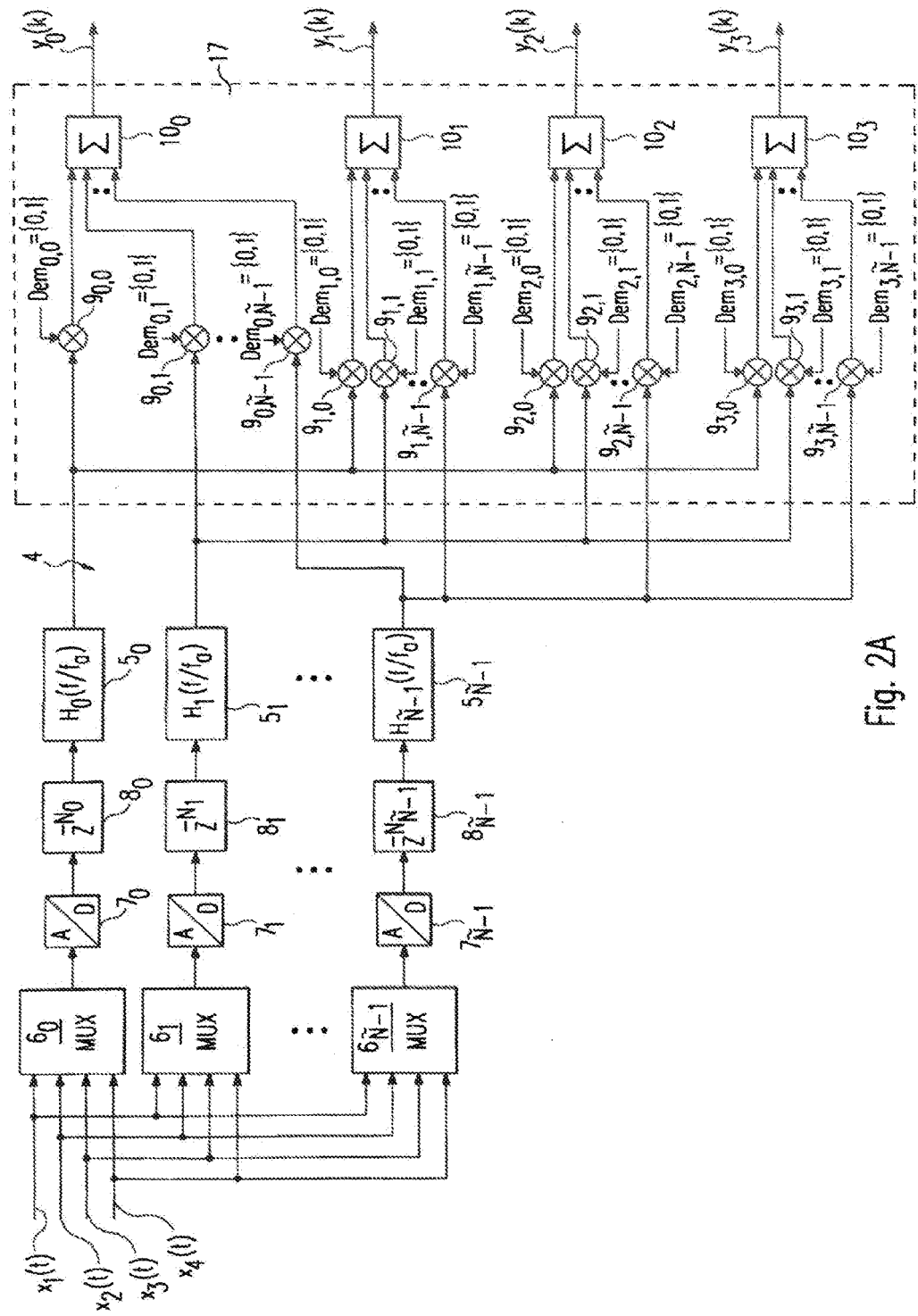
FIG. 2A a block-circuit diagram of a first exemplary embodiment of an equalisation filter comprising several parallel sub-filters.

FIG. 2A shows a first embodiment of an equalisation filter 4 according to the invention with several respectively mutually parallelised sub-filters $5_0, 5_1, \ldots 5_{\tilde{N}-1}$.

The equalisation filter according to the invention is not designed only for equalising a single equalised signal, but also allows the parallel equalisation of several distorted signals. For example, in the equalisation filter 4 of FIG. 2A, four distorted signals $x_1(t), x_2(t), x_3(t), x_4(t)$ are supplied in parallel to the equalisation filter 4.

The equalisation filter 4 can use its total of $\tilde{N}$ mutually parallelised sub-filters $5_0, 5_1, \ldots, 5_{\tilde{N}-1}$ flexibly with a sequence of respectively successive filter coefficients to equalise a single distorted signal, or it can use its total of $\tilde{N}$ mutually parallelised sub-filters $5_0, 5_1, \ldots, 5_{\tilde{N}-1}$ for the parallel equalisation of several distorted signals. The allocation of the individual distorted signals $x_1(t), x_2(t), x_3(t), x_4(t)$ to the individual, mutually parallelised sub-filters $5_0, 5_1, \ldots, 5_{\tilde{N}-1}$ is implemented in each case via a multiplexer unit $6_0, 6_1, \ldots, 6_{\tilde{N}-1}$ connected upstream in each case of the mutually parallelised sub-filters $5_0, 5_1, \ldots, 5_{\tilde{N}-1}$. The control of the individual multiplexer units $6_0, 6_1, \ldots, 6_{\tilde{N}-1}$ is implemented via a higher order process control unit not shown in FIG. 2A.

The analog, distorted signal $x_1(t), x_2(t), x_3(t)$ or $x_4(t)$ supplied in each case to the individual, mutually parallelised sub-filters $5_0, 5_1, \ldots, 5_{\tilde{N}-1}$ in each case via an allocated multiplexer unit $6_0, 6_1, \ldots, 6_{\tilde{N}-1}$ is converted in each case in a downstream analog-digital converter $7_0, 7_1, \ldots, 7_{\tilde{N}-1}$ into a corresponding digital signal $x_1(k), x_2(k), x_3(k)$ or $x_4(k)$.

The signal $x_1(k), x_2(k), x_3(k)$ or $x_4(k)$ digitally converted in each case by the respective analog-digital converter $7_0, 7_1, \ldots, 7_{\tilde{N}-1}$ is delayed in a respectively downstream delay unit $8_0, 8_1, \ldots, 8_{\tilde{N}-1}$ by a number $N_i$ of sampled values, which corresponds to the relative position $N_i$ of the first filter coefficient of the sequence of respectively successive filter coefficients associated with the respectively mutually parallelised sub-filter $5_0, 5_1, \ldots, 5_{\tilde{N}-1}$ relative to the position of the first filter coefficient of the total equalisation filter 4. The flexible allocation of the number $N_0, N_1, \ldots, N_{\tilde{N}-1}$ of sampled values to the respective delay unit $8_0, 8_1, \ldots, 8_{\tilde{N}-1}$ is also implemented via the higher order process control, which is not illustrated in FIG. 2A. Alternatively, the individual delay units $8_0, 8_1, \ldots, 8_{\tilde{N}-1}$ can also be connected downstream of the respectively mutually parallelised sub-filters $5_0, 5_1, \ldots, 5_{\tilde{N}-1}$.

In the subsequent mutually parallelised sub-filters $5_0, 5_1, \ldots, 5_{\tilde{N}-1}$ with the associated transmission functions $H_0(f/f_a), H_1(f/f_a), \ldots, H_{\tilde{N}-1}(f/f_a)$, the respectively supplied digital signal $x_1(k), x_2(k), x_3(k)$ or $x_4(k)$ delayed in each case by $N_0, N_1, \ldots, N_{\tilde{N}-1}$ sampling times is convoluted with the associated sequence of respectively successive filter coefficients of the respective sub-filter $5_0, 5_1, \ldots, 5_{\tilde{N}-1}$ configured in parallel with one another, and accordingly, a partial equalisation of the respective, distorted digital signal $x_1(k), x_2(k), x_3(k)$ or $x_4(k)$ is achieved.

The supply of the signals each partially equalised in the individual mutually parallelised sub-filters $5_0$, $5_1$, ..., $5_{\bar{N}-1}$ to form integrated equalised signals $y_1(k)$, $y_2(k)$, $y_3(k)$ or $y_4(k)$ takes place through a first embodiment of a unit 17 for connecting the sub-filter output signals through to an output channel.

This first embodiment of a unit 17 for connecting the sub-filter output signals through to an output channel comprises, on the one hand, a number of multiplier elements $9_{0,0}$, $9_{0,1}$, ..., $9_{0,\bar{N}-1}$, $9_{1,0}$, $9_{1,1}$, ..., $9_{1,\bar{N}-1}$, $9_{2,0}$, $9_{2,1}$, ..., $9_{2,\bar{N}-1}$, $9_{3,0}$, $9_{3,1}$, ..., $9_{3,\bar{N}-1}$ corresponding to the number of signals capable of being equalised in each case in parallel in the equalisation filter 4, which are each connected downstream of the respective mutually parallelised sub-filters $5_0$, $5_1$, ..., $5_{\bar{N}-1}$, and through a number of summation elements $10_0$, $10_1$, $10_2$ or $10_3$ corresponding to the number of signals capable of being equalised in each case in parallel in the equalisation filter 4. In each case, a multiplier element $9_{0,0}$, $9_{0,1}$, ..., $9_{0,\bar{N}-1}$, $9_{1,0}$, $9_{1,1}$, ..., $9_{1,\bar{N}-1}$, $9_{2,0}$, $9_{2,1}$, ..., $9_{2,\bar{N}-1}$, $9_{3,0}$, $9_{3,1}$, ..., $9_{3,\bar{N}-1}$ which is connected downstream of every mutually parallelised sub-filter $5_0$, $5_1$, ..., $5_{\bar{N}-1}$, is connected to one of the summation elements $10_0$, $10_1$, $10_2$ or $10_3$.

The multiplier elements $9_{0,0}$, $9_{0,1}$, ..., $9_{0,\bar{N}-1}$, $9_{1,0}$, $9_{1,1}$, ..., $9_{1,\bar{N}-1}$, $9_{2,0}$, $9_{2,1}$, ..., $9_{2,\bar{N}-1}$, $9_{3,0}$, $9_{3,1}$, ..., $9_{3,\bar{N}-1}$ each serve as switches, and, in each case connect through the partially equalised signal with the control signal "1", and connect through a zero level signal with a control signal "0". The control of the individual multiplier elements $9_{0,0}$, $9_{0,1}$, ..., $9_{0,\bar{N}-1}$, $9_{1,0}$, $9_{1,1}$, ..., $9_{1,\bar{N}-1}$, $9_{2,0}$, $9_{2,1}$, ..., $9_{2,\bar{N}-1}$, $9_{3,0}$, $9_{3,1}$, ..., $9_{3,\bar{N}-1}$ takes place, in turn, through the higher order process control unit, not illustrated in FIG. 2A. Instead of a multiplier $9_{0,0}$, $9_{0,1}$, ..., $9_{0,\bar{N}-1}$, $9_{1,0}$, $9_{1,1}$, ..., $9_{1,\bar{N}-1}$, $9_{2,0}$, $9_{2,1}$, ..., $9_{2,\bar{N}-1}$, $9_{3,0}$, $9_{3,1}$, ..., $9_{3,\bar{N}-1}$, a multiplexer, of which the first input is connected to the output of the respective sub-filter $5_0$, $5_1$, ..., $5_{\bar{N}-1}$, and a zero signal is present at the second input, can also be used as an alternative.

The signals $y_1(k)$, $y_2(k)$, $y_3(k)$ or $y_4(k)$ equalised in an integrated manner in the equalisation filter 4 are present at the output of the individual summation elements $10_0$, $10_1$, $10_2$ or $10_3$.

Figure 2B:
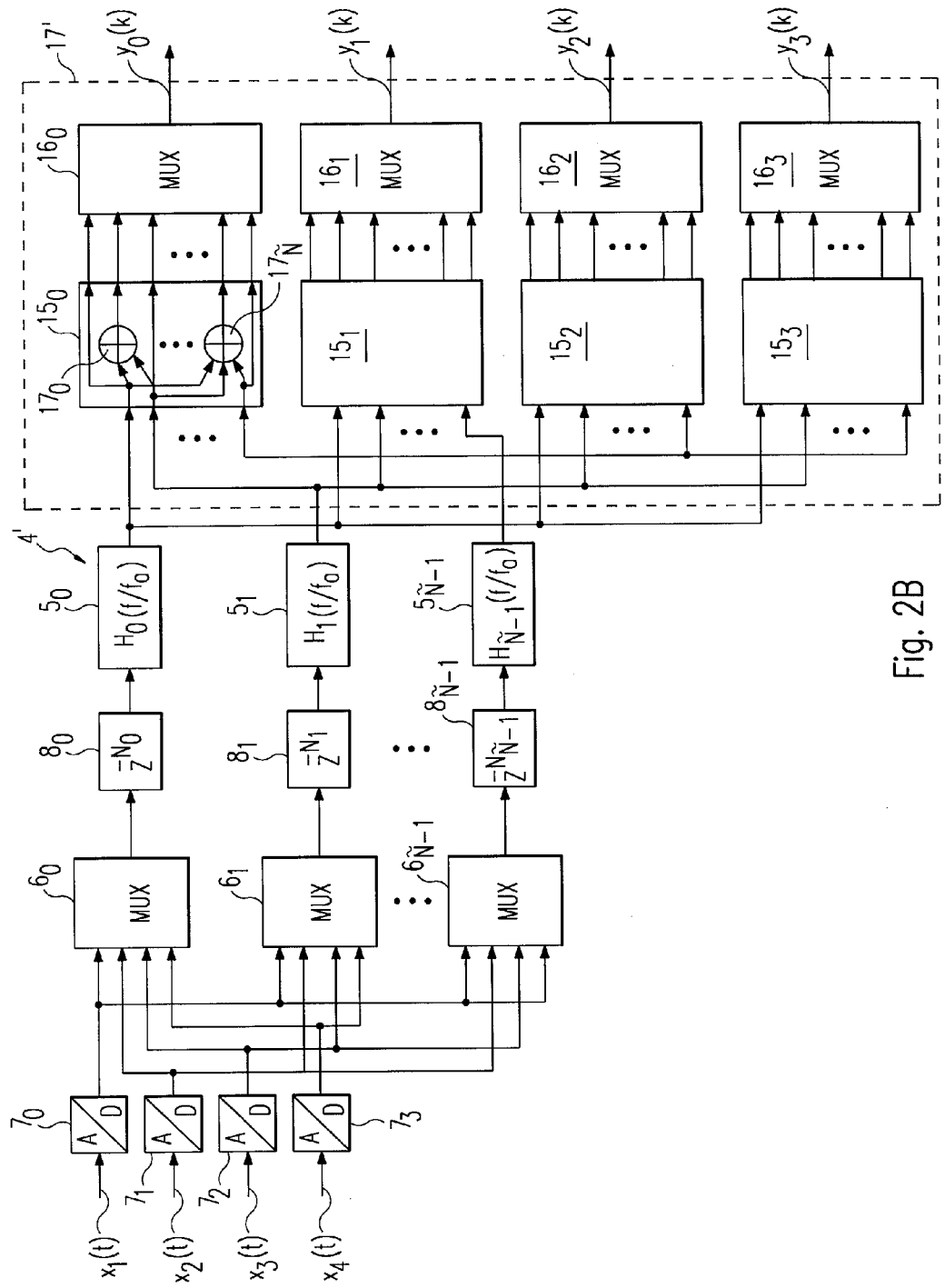
FIG. 2B a block-circuit diagram of a second exemplary embodiment of an equalisation filter comprising several parallel sub-filters.

FIG. 2B shows a second embodiment of an equalisation filter 4' according to the invention with several mutually parallelised sub-filters $5_0$, $5_1$, ..., $5_{\bar{N}-1}$.

Identical functional units to the first embodiment are provided with identical reference numbers and will not be described again.

The analog-digital converters $7_0$, $7_1$, ..., $7_{\bar{N}-1}$, which, in the first embodiment, are connected downstream of the multiplexers $6_0$, $6_1$, ..., $6_{\bar{N}-1}$, which are realised in an analog manner, are connected, in the second embodiment, upstream of the multiplexers $6_0$, $6_1$, ..., $6_{\bar{N}-1}$, which in this case are realised digitally. Accordingly, in each case, an analog-digital converter $6_0$, $6_1$, $6_2$ and $6_3$ is provided in each reception channel.

The supply of the signals partially equalised in each case in the individual mutually parallelised sub-filters $5_0$, $5_1$, ..., $5_{\bar{N}-1}$, to form integrated equalised signals $y_1(k)$, $y_2(k)$, $y_3(k)$ or $y_4(k)$ takes place through a second embodiment of a unit 17' for connecting the sub-filter output signals through to an output channel, which, for each output channel, comprises a series circuit comprising a unit $15_0$, $15_1$, $15_2$ and $15_3$ for generating all signal combinations at the respective output channel and a multiplexer $16_0$, $16_1$, $16_2$ and $16_3$.

The individual units $15_0$, $15_1$, $15_2$ and $15_3$ for generating all signal combinations at the respective output channel are each supplied with the output signals of all sub-filters $5_0$, $5_1$, ..., $5_{\bar{N}-1}$ and provide an identical internal structure. On the one hand, they connect the output signals of all sub-filters $5_0$, $5_1$, ..., $5_{\bar{N}-1}$ through to the respective output and, on the other hand, they add all possible combinations of the additive linking of at least two output signals of the sub-filters $5_0$, $5_1$, ..., $5_{\bar{N}-1}$ in each case in an adder $17_0$, ..., $17_k$ to form a signal guided to a respective output.

By means of a control signal of a higher order process control unit not shown in FIG. 2B, each downstream multiplexer $16_0$, $16_1$, $16_2$ and $16_3$ connects the signal, which is present at the output of the upstream unit $15_0$, $15_1$, $15_2$ and $15_3$ for generating all signal combinations at the respective output channel and is therefore present at the respective input of each multiplexer $16_0$, $16_1$, $16_2$ und $16_3$, through to the output of the multiplexer $16_0$, $16_1$, $16_2$ und $16_3$.

In this manner, a variable combination of each of the signals partially filtered in the individual sub-filters $5_0$, $5_1$, ..., $5_{\bar{N}-1}$ is possible on the individual output channels. Alongside the possibilities illustrated in FIGS. 2A and 2B for the variable combination of the signals partially filtered in each of the individual sub-filters $5_0$, $5_1$, ..., $5_{\bar{N}-1}$ on the individual output channels, there are other realisations which are also covered by the invention.

Figure 4A:
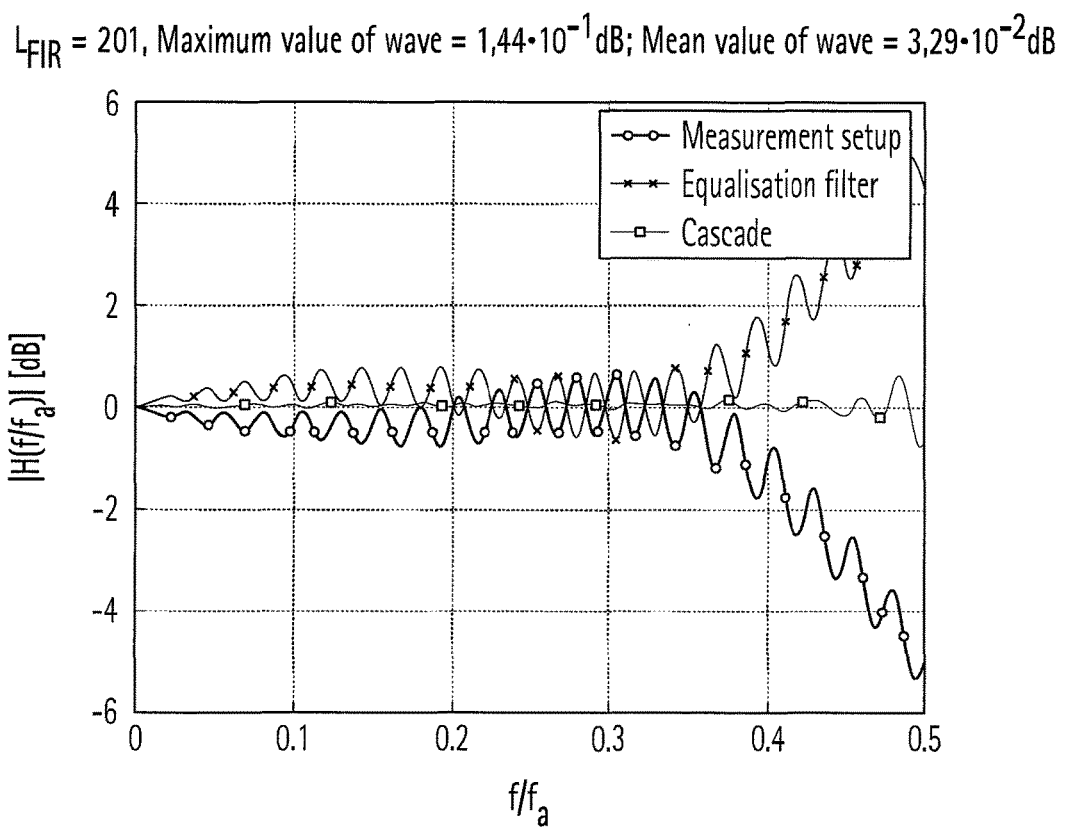
FIG. 4A a spectral view of the magnitude characteristic of the transmission function of the measurement setup, the equalisation filter and the cascade comprising measurement setup and equalisation filter.

FIG. 4A shows the magnitude characteristics of the spectra of the measurement setup 1, the equalisation filter 4 and the cascade comprising measurement setup 1 and equalisation filter 4 in the payload signal range $f/f_a = 0 \ldots 0,4$ and in the transmission range $f/f_a = 0,4 \ldots 0,5$. In this context, a weighting function $W(f/f_a)$ of one is used for the payload signal range, and a weighting function $W(f/f_a)$ declining from 0.4 dB to 0 dB is used for the transmission range.

It is evident that the spectral components of the transmission function of the measurement setup 1, which are comparatively slightly variable with regard to magnitude—largely constant characteristic in the payload signal range and declining characteristic in the transition range—and also the spectral components of the transmission function of the measurement setup 1, which are comparatively significantly variable with regard to magnitude—approximately sinusoidal superposed characteristic—are compensated by the transmission function of the equalisation filter 4 which has been inverted for this purpose.

Figure 4B:
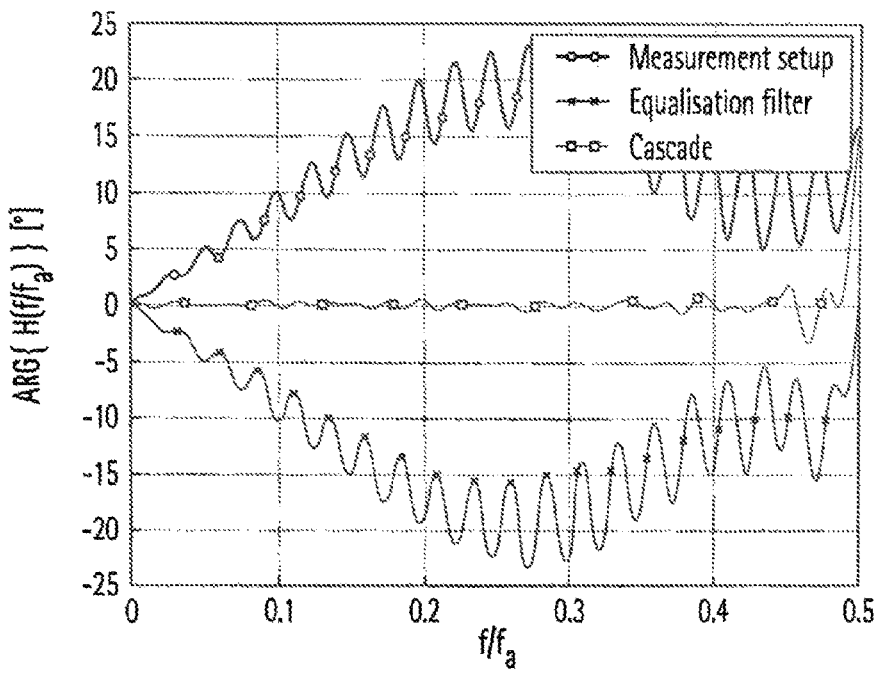
FIG. 4B a spectral view of the phase characteristic of the transmission function of the measurement setup, the equalisation filter and the cascade comprising measurement setup and equalisation filter.

FIG. 4B shows the associated phase characteristics of the spectra of the measurement setup 1, the equalisation filter 4 and the cascade comprising measurement setup 1 and equalisation filter 4. With regard to phase also, the slightly variable spectral components and also the significantly variable spectral components of the measurement setup 1 are both compensated by the respectively associated spectral components of the equalisation filter 4.

Figure 1B:
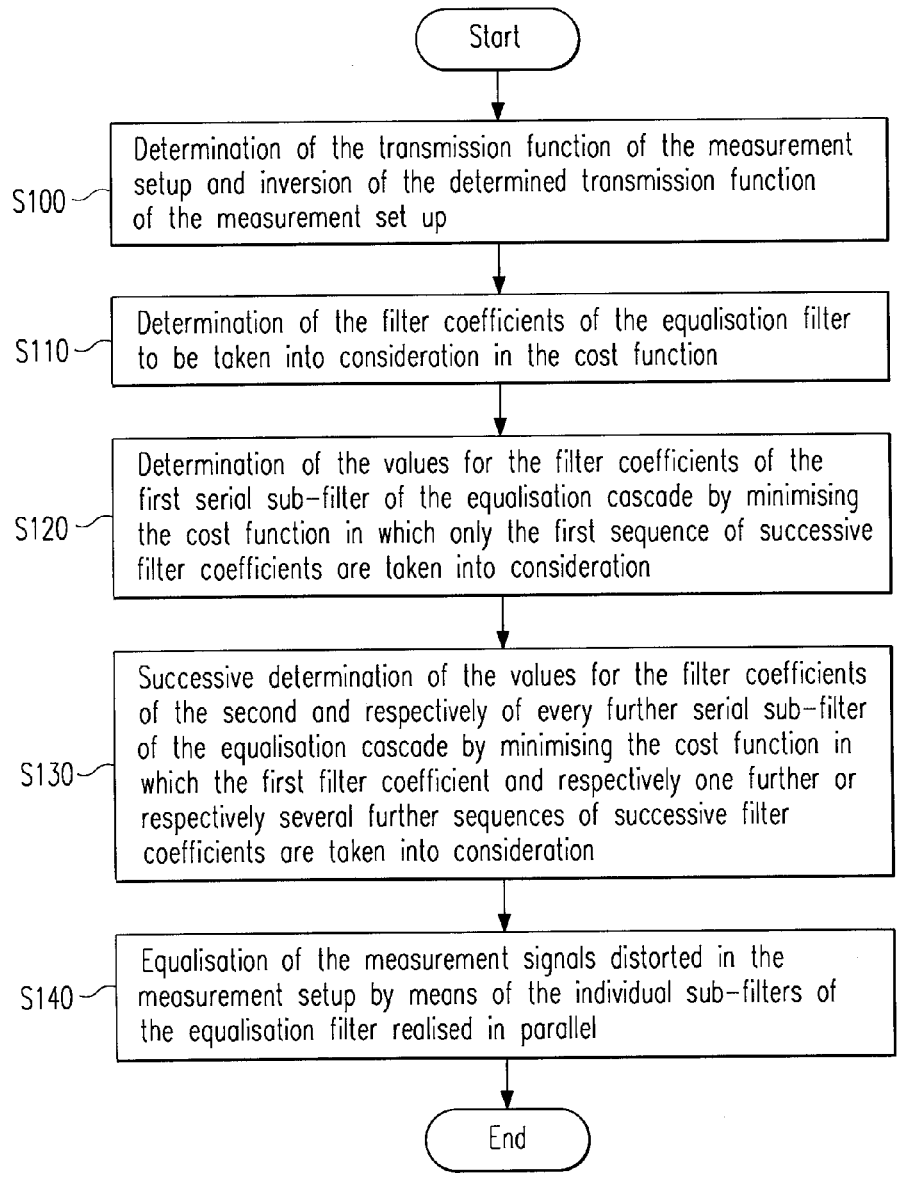
FIG. 1B a flow chart of an exemplary embodiment of the method for the equalisation of at least one signal distorted by a measurement setup with an equalisation cascade comprising several serial sub-filters.
Figure 2C:
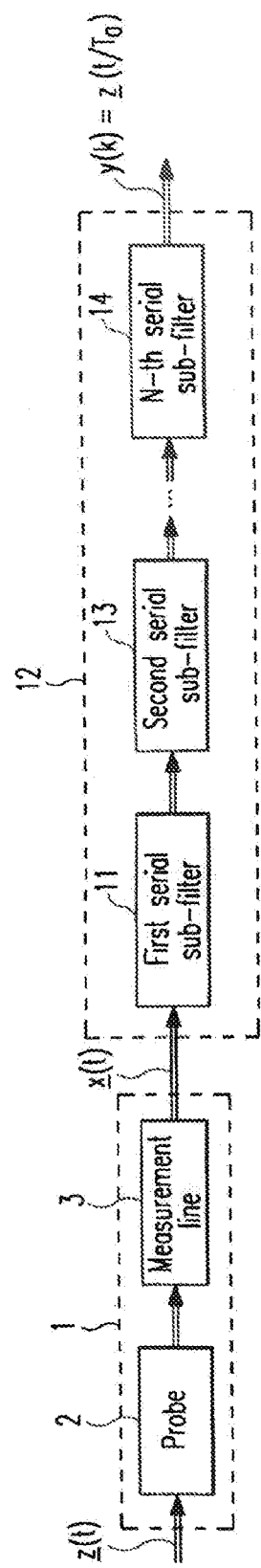
FIG. 2C a block-circuit diagram of an equalisation cascade comprising several serial sub-filters.

In the following, the method according to the invention for equalising a signal distorted by a measurement setup with an equalisation cascade of several sub-filters connected in series, preferably with a first sub-filter and a second sub-filter, are explained with reference to the flow chart in FIG. 1B and the block-circuit diagram in FIG. 2C.

The first two method steps S100 and S110 correspond to the method steps S10 and S20 of the method according to the invention for equalising at least one signal distorted by a measurement setup with an equalisation filter comprising several sub-filters configured in parallel.

Figure 5A:
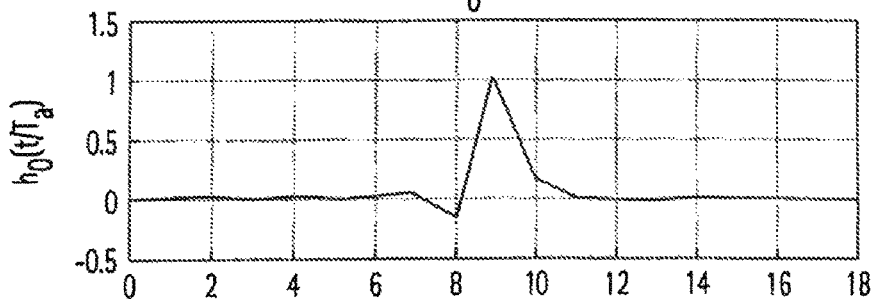
FIG. 5A a time-flow chart of the impulse response of the first serial sub-filter of the equalisation cascade.

In the next method step S120, the values of the filter coefficients for the first serial sub-filter 11 are determined. For this purpose, only the filter coefficients of the first sequence of respectively successive filter coefficients of all sequences determined in the preceding method step S110 and to be taken into consideration in the cost function K are taken into consideration according to the time-flow diagram in FIG. 5A or the left-hand time-flow chart in FIG. 7.

With reference to equation (18), the values for the filter coefficients $\underline{h}_{FIRA}$ of the first serial sub-filter 11 of the equalisation cascade 12, which has been determined by minimising a cost function K on the basis of the smallest mean error squared criterion are determined. For this purpose, the matrix $\underline{\underline{A}}$ according to equation (15) and the vector $\underline{b}$ according to equation (16), which are obtained, in turn, from the weighting function $\underline{W}$ and the matrix $\underline{\underline{A}}$ according to equation (12) and the vector $\underline{b}$ according to equation (13), are calculated. For the individual measurement frequencies $f/f_a$, the matrix $\underline{\underline{A}}$ contains, in each case, the individual complex variables $z=e^{j2\pi f/f_a}$ for the Fourier transformed first sequence of respectively successive filter coefficients. For the individual measurement frequencies $f/f_a$, the vector $\underline{b}$ contains, in each case, the desired reference transmission functions $H_d(f/f_a)$, which correspond to the inverse transmission function of the measurement setup 1 determined in method step S100.

The filter coefficients of the first serial sub-filter 11 equalise the distortions of the measurement signal x(t) distorted by the measurement setup 1, which result from the comparatively slightly variable spectral components of the transmission function of the measurement setup 1.

Figure 6A:
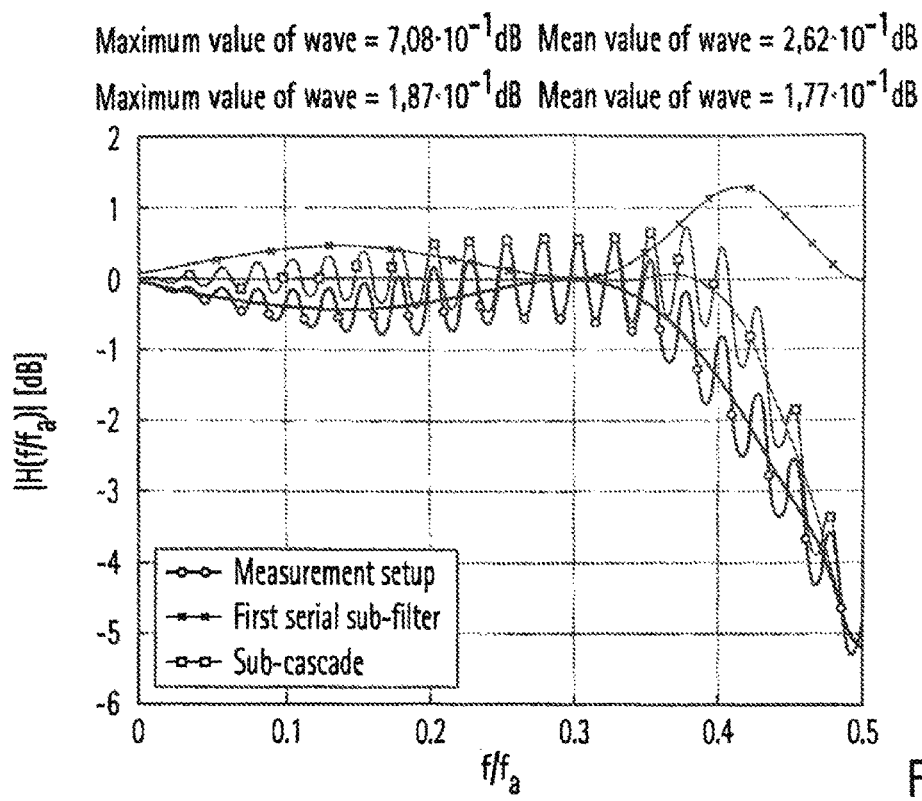
FIG. 6A a spectral view of the magnitude characteristic of the transmission function of the measurement setup, the first serial sub-filter and the cascade comprising measurement setup and first serial sub filter.

FIG. 6A presents the magnitude characteristics of the non-averaged spectrum and the averaged spectrum of the measurement setup 1, of the first serial sub-filter 11 and of the sub-cascade comprising measurement setup 1 and first serial sub-filter 11. In this context, a weighting function $W(f/f_a)$ of one is used for the payload signal range, and a weighting function $W(f/f_a)$ of $10^{-20/10}$ is used for the transition range. It is evident that the first serial sub-filter 11, of which the spectrum corresponds to the averaged spectrum of the measurement setup 1, compensates the comparatively slightly variable spectral components of the measurement setup 1, while the comparatively significantly variable spectral components of the measurement setup 1 with regard to magnitude are still contained in the spectrum of the sub-cascade.

Figure 6B:
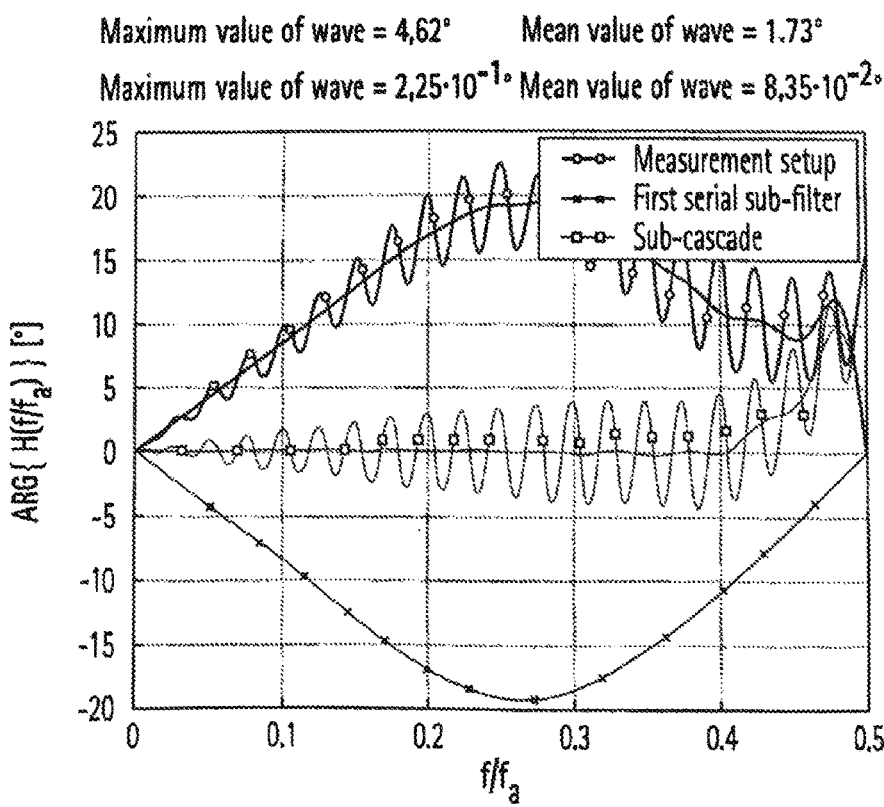
FIG. 6B a spectral view of the phase characteristic of the transmission function of the measurement setup, the first sub-filter and the cascade comprising measurement setup and first sub-filter.

The phase characteristics of the non-averaged spectrum and of the averaged spectrum of the measurement setup 1, of the first serial sub-filter 11 and of the sub-cascade comprising measurement setup 1 and first serial sub-filter 11 illustrated in FIG. 6B also show that only the comparatively slightly variable spectral components of the measurement setup 1 are compensated by the first serial sub-filter 11.

In the next method step S140, the filter coefficients of the second serial sub-filter 13 and of every further serial sub-filter are determined.

The filter coefficients of the second serial sub-filter 13 of the equalisation cascade 12 are determined by initially determining the reference transmission function $\overline{H}_d(f/f_a)$ for the second serial sub-filter 13. The reference transmission function $\overline{H}_d(f/f_a)$ for the second serial sub-filter 13 corresponds to the part of the distortion of the measurement setup 1 of the original distortion of the measurement setup 1 which is still present after the equalisation by the first serial sub-filter 11 and which must still be equalised. This reference transmission function $\overline{H}_d(f/f_a)$ for the second serial sub-filter 13 is consequently obtained according to equation (22) from the quotient of the reference transmission function $H_d(f/f_a)$ of the total equalisation cascade 12 and of the transmission function $H_{FIRA}(f/f_a)$ of the first serial sub-filter 11 which is obtained from the Fourier transform of the filter coefficients $\underline{h}_{FIRA}$ of the first serial sub-filter 11 determined in the preceding method step S120.

In order to determine the filter coefficients $\underline{h}_{FIRB}$ of the second serial sub-filter 13, thereby minimising the cost function K, the matrix $\underline{\underline{A}}$ according to equation (15) and the vector $\underline{b}$ according to equation (16)—which are obtained, in turn, from the weighting function $\underline{W}$ and the matrix $\underline{\underline{A}}$ according to equation (12) and the vector $\underline{b}$ according to equation (13)—are once again calculated with reference to equation (18).

In a first variant, if several sequences of respectively successive filter coefficients must still be taken into consideration in the cost function K to be minimised in order to determine the values of the filter coefficients $\underline{h}_{FIRB}$ of the second serial sub-filter 13, these sequences of respectively successive filter coefficients can be realised only in the second serial sub-filter 13. The individual complex variables $z=e^{j2\pi f/f_a}$ in the matrix $\underline{\underline{A}}$ must therefore be defined for all the sequences of respectively successive filter coefficients and for the first filter coefficient and for the individual measurement frequencies $f/f_a$.

In a second variant, the second serial sub-filter 13 takes over only the first sequence of respectively successive filter coefficients of the still remaining sequences of respectively successive filter coefficients after the equalisation by the first serial sub-filter 11. For this variant also, the individual complex variables $z=e^{j2\pi f/f_a}$ in the matrix $\underline{\underline{A}}$ must also be defined for this one sequence of respectively successive filter coefficients and for the first filter coefficients and for the individual measurement frequencies $f/f_a$.

In order to determine the filter coefficients of the second serial sub-filter 13 up to N-th serial sub-filter 14, once again with reference to equation (22), the reference transmission function $\overline{H}_d(f/f_a)$ for the respective serial sub-filter is determined from the quotient between the reference transmission function $H_d(f/f_a)$ of the total equalisation filter 4 and the product of the transmission functions of all previously determined serial sub-filters, which are calculated in each case by Fourier transform from the respectively determined filter coefficients. The individual complex variables $z=e^{j2\pi f/f_a}$ in the matrix $\underline{\underline{A}}$ must be defined correspondingly for the respective sequence(s) of respectively successive filter coefficients and for the first filter coefficient and for the individual measurement frequencies $f/f_a$.

One substantial technical advantage of an equalisation cascade, which must be mentioned here is that, because of the convolution effect, the summated number of filter coefficients of the first, second and every further serial sub-filter is reduced by comparison with the number of filter coefficients of a single equalisation filter, which corresponds to the number of impulse response coefficients in the right-hand time flow diagram of FIG. 7.

Figure 5B:
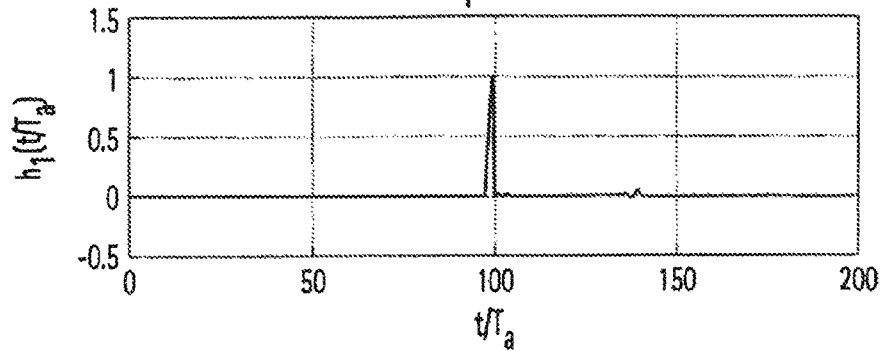
FIG. 5B a time-flow chart of the impulse response of the second serial sub-filter of the equalisation cascade.

FIG. 5B shows the impulse response of the second sub-filter 13 with an impulse-response coefficient at the sampling time zero, a total of 30 successive impulse-response coefficients from the time 99 and a total of 10 impulse-response coefficients from the time 140.

In the final method step S140, the measurement signal x(t) distorted by the measurement setup 1 is convoluted with the filter coefficients of the first sub-filter 11 to be taken into consideration for the equalisation, and determined in method step S120, and the filter coefficients of the second sub-filter 13 and every further serial sub-filter, determined in method step S130, and accordingly equalised.

While method steps S100 to S130 are implemented once in advance in a calibration phase, method step S140 is implemented continuously throughout the entire measurement process.

If several sequences of respectively successive filter coefficients are realised in each case in the second serial filter 13 and/or in every further serial sub-filter, each individual sequence can preferably be embedded respectively in one of several mutually parallelised sub-sub filters according to FIG. 2A in the second serial sub-filter 13 and/or in every further serial sub-filter.

Figure 6C:
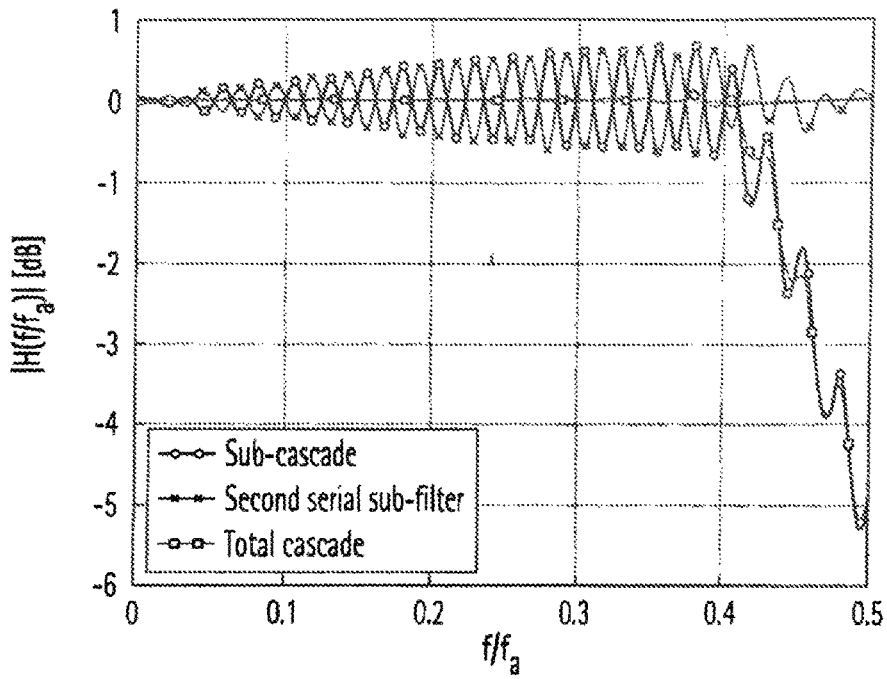
FIG. 6C a spectral view of the magnitude characteristic of the cascade comprising measurement setup and first serial sub-filter, the second serial sub-filter and the cascade comprising measurement setup, first serial sub-filter and second serial sub-filter.

FIG. 6C shows the magnitude characteristics of the spectra of the first sub-cascade, of the second sub-filter 13 and of the total equalisation cascade 12. In this context, a weighting function $W(f/f_a)$ of one is used for the payload signal range and a weighting function $W(f/f_a)$ of $10^{-20/10}$ is used for the transmission range. It is evident that the significantly variable spectral components of the transmission function of the measurement setup 1 not yet compensated by the first sub-cascade are compensated by the spectral components of the second sub-filter 13.

Figure 6D:
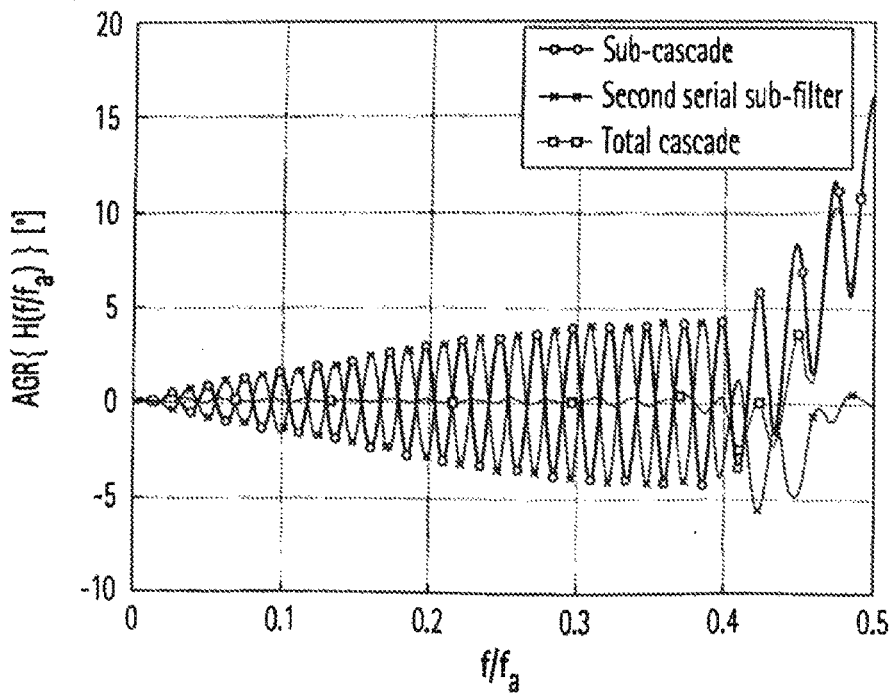
FIG. 6D a spectral view of the phase characteristic of the cascade comprising measurement setup and first serial sub-filter, the second serial sub-filter and the cascade comprising measurement setup, first serial sub-filter and second serial sub-filter.

In an equivalent manner, it is evident from FIG. 6D that the comparatively significantly variable spectral components of the transmission function of the measurement setup 1 with regard to phase are compensated by the spectral components of the second sub-filter 13.

The present disclosure is not restricted to the embodiments presented. In particular, all combinations of all of the features claimed in the individual claims, of all features disclosed respectively in the description and of all features illustrated in the individual Figs. of the drawings are also covered by the present disclosure.

The invention claimed is:

1. An equalisation filter for equalising a signal distorted by a measurement setup with filter coefficients determined by minimising a cost function K,
   wherein, in each case, only sequences of respectively successive filter coefficients of the equalisation filter which make a significant contribution to the equalisation are taken into consideration in the cost function K,
   wherein the equalisation filter comprises several mutually parallel configured sub-filters ($5_0$, $5_1$, ..., $5_{\tilde{N}-1}$), wherein each mutually parallel configured sub-filter ($5_0$, $5_1$, ..., $5_{\tilde{N}-1}$) comprises a sequence of respectively successive filter coefficients taken into consideration in the cost function K, and
   wherein in each case, a delay unit ($8_0$, $8_1$, ..., $8_{\tilde{N}-1}$) is connected upstream or downstream of every mutually parallel configured sub-filter ($5_0$, $5_1$, ... $5_{\tilde{N}-1}$), which delays the signal supplied to or respectively derived from each mutually parallel configured sub-filter ($5_0$, $5_1$, ... $5_{\tilde{N}-1}$) by a number $N_i$ of sampled values, which corresponds to the spacing $N_i$ from the first filter coefficient of the sequence i processed by the respective mutually parallel configured sub-filter ($5_0$, $5_1$, ..., $5_{\tilde{N}-1}$) to the first filter coefficient of the equalisation filter.

2. The equalisation filter according to claim 1, wherein the measurement setup is a probe and/or a measurement line.

3. The equalisation filter according to claim 1, wherein in each case, a multiplexer unit ($6_0$, $6_1$, ..., $6_{\tilde{N}-1}$) for the supply of a signal distorted by at least one disposed at an input of respectively one measurement channel, is connected upstream of the respectively mutually parallel configured sub-filter ($5_0$, $5_1$, ..., $5_{\tilde{N}-1}$) or respectively of the delay unit ($8_0$, $8_1$, ..., $8_{\tilde{N}-1}$) associated with the respectively mutually parallel configured sub-filter ($5_0$, $5_1$ ..., $5_{\tilde{N}-1}$).

4. The equalisation filter according to claim 3, wherein in order to connect the distorted signal supplied to the respective mutually parallel configured sub-filter ($5_0$, $5_1$, ..., $5_{\tilde{N}-1}$) through to the output of the respective measurement channel, a unit (17;17') is provided for connecting the sub-filter output signals through to an output channel.

5. The equalisation filter according to claim 4, wherein in the unit for connecting the sub-filter output signals through to an output channel, in each case, a number of multiplier elements ($_{0,0}$, $9_{0,1}$, ..., $9_{0,\tilde{N}-1}$, $9_{1,0}$, $9_{1,1}$, ..., $9_{1,\tilde{N}-1}$, $9_{2,0}$, $9_{2,1}$, ..., $9_{2,\tilde{N}-1}$, $9_{3,0}$, $9_{3,1}$, ..., $9_{3,\tilde{N}-1}$) corresponding to the number of measurement channels is connected downstream of every mutually parallel configured sub-filter ($5_0$, $5_1$, ..., $5_{\tilde{N}-1}$) or respectively of every delay unit ($8_0$, $8_1$, ..., $8_{\tilde{N}-1}$) associated in each case with the respective mutually parallel configured sub-filter ($5_0$, $5_1$, ..., $5_{\tilde{N}-1}$).

6. The equalisation filter according to claim 5, wherein the outputs, in each case, of one multiplier element ($_{0,0}$, $9_{0,1}$, ..., $9_{0,\tilde{N}-1}$, $9_{1,0}$, $9_{1,1}$, ..., $9_{1,\tilde{N}-1}$, $9_{2,0}$, $9_{2,1}$, ..., $9_{2,\tilde{N}-1}$, $9_{3,0}$, $9_{3,1}$, ..., $9_{3,\tilde{N}-1}$) which is connected respectively downstream of each mutually parallel configured sub-filter ($5_0$, $5_1$, ..., $5_{\tilde{N}-1}$) or respectively of each delay unit ($8_0$, $8_1$, ..., $8_{\tilde{N}-1}$) associated with the respective mutually parallel configured sub-filter ($5_0$, $5_1$, ..., $5_{\tilde{N}-1}$), are connected, in each case, to one summation element ($10_0$, $10_1$, $10_2$, $10_3$).

7. An equalisation filter for equalising a signal distorted by a measurement setup with filter coefficients determined by minimising a cost function K,
   wherein, in each case, only sequences of respectively successive filter coefficients of the equalisation filter which make a significant contribution to the equalisation are taken into consideration in the cost function K, and
   wherein the equalisation filter is an equalisation cascade comprising at least two serial sub-filters.

8. The equalisation filter according to claim 7, wherein the second serial sub-filter or every further serial sub-filter in each case comprises several mutually parallel configured sub-sub-filters.

* * * * *